(12) United States Patent
Iino et al.

(10) Patent No.: US 6,370,013 B1
(45) Date of Patent: Apr. 9, 2002

(54) ELECTRIC ELEMENT INCORPORATING WIRING BOARD

(75) Inventors: Yuji Iino; Hiromi Iwachi; Katsura Hayashi, all of Kagoshima (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 09/717,541

(22) Filed: Nov. 21, 2000

(30) Foreign Application Priority Data

| Nov. 30, 1999 | (JP) | 11-339880 |
| Feb. 29, 2000 | (JP) | 2000-053998 |
| Feb. 29, 2000 | (JP) | 2000-054000 |
| May 30, 2000 | (JP) | 2000-160749 |
| May 29, 2000 | (JP) | 2000-158824 |

(51) Int. Cl.$^7$ .................................. H01G 4/228
(52) U.S. Cl. .................. 361/306.3; 361/309; 361/763
(58) Field of Search .................. 361/306.3, 307, 361/308.3, 309, 313, 321.2, 329, 330, 306.1, 763, 811, 807, 809

(56) References Cited

U.S. PATENT DOCUMENTS

| 5,027,253 A | * | 6/1991 | Lauffer et al. | 361/321.4 |
| 5,406,446 A | * | 4/1995 | Peters et al. | 361/306.1 |
| 5,745,335 A | * | 4/1998 | Watt | 361/313 |
| 6,184,589 B1 | * | 2/2001 | Budnaitis et al. | 257/924 |

FOREIGN PATENT DOCUMENTS

| JP | 2-121393 | 5/1990 |
| JP | 7-142871 | 6/1995 |
| JP | 10-51150 | 2/1998 |
| JP | 10-92966 | 4/1998 |
| JP | 11-220262 | 8/1999 |

* cited by examiner

Primary Examiner—Anthony Dinkins
(74) Attorney, Agent, or Firm—Hogan & Hartson, L.L.P.

(57) ABSTRACT

A wiring board that incorporates electric element such as capacitor. The wiring board includes a dielectric substrate having electronic components mounting surface on the surface thereof, an electric element that is embedded in the dielectric substrate, a first conductive layer and a second conductive layer formed inside of the dielectric substrate, and via hole conductors that connect the first terminal electrode and the second terminal electrode of the electric element to the first conductive layer and the second conductive layer, respectively, and extend the surface of the dielectric substrate from the first and second conductive layers. In case both the first and the second terminal electrodes are provided in plurality, all of the plurality of first terminal electrodes are connected to the first conductive layer through the via hole conductors and all of the plurality of second terminal electrodes are connected to the second conductive layer through the via hole conductors.

27 Claims, 10 Drawing Sheets

FIG. 2A
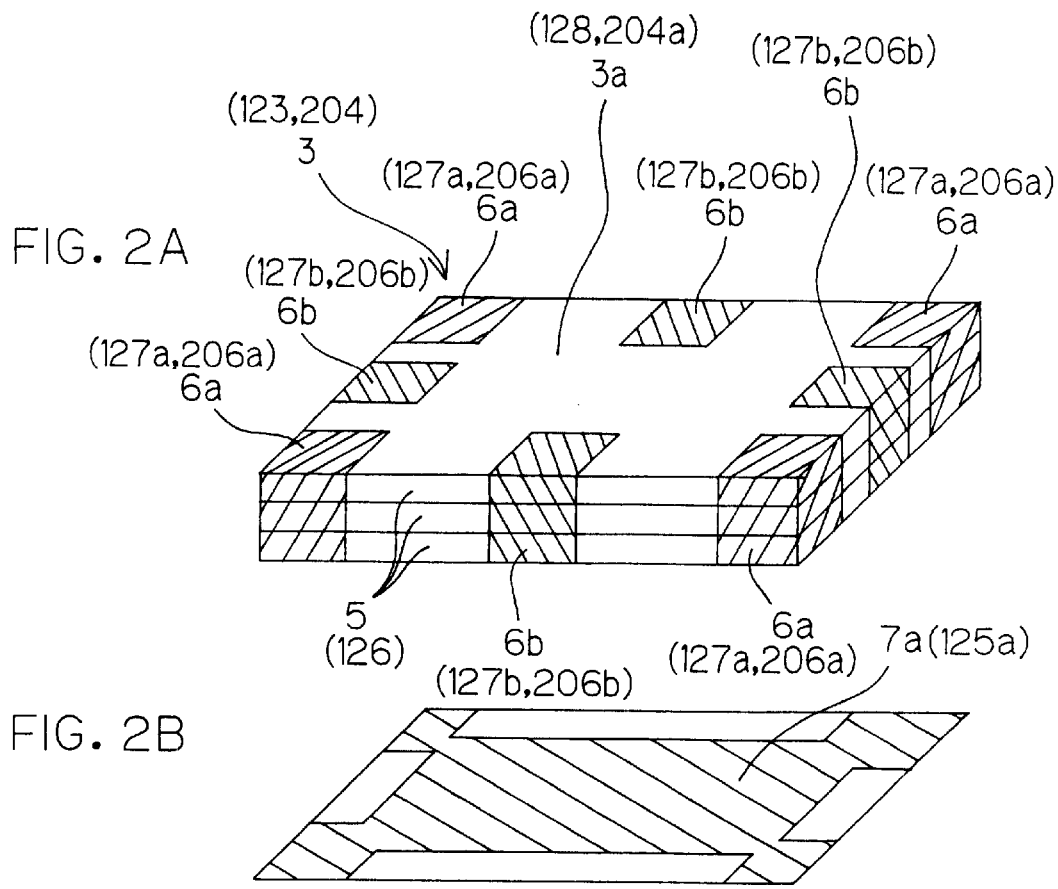
FIG. 2B
FIG. 2C
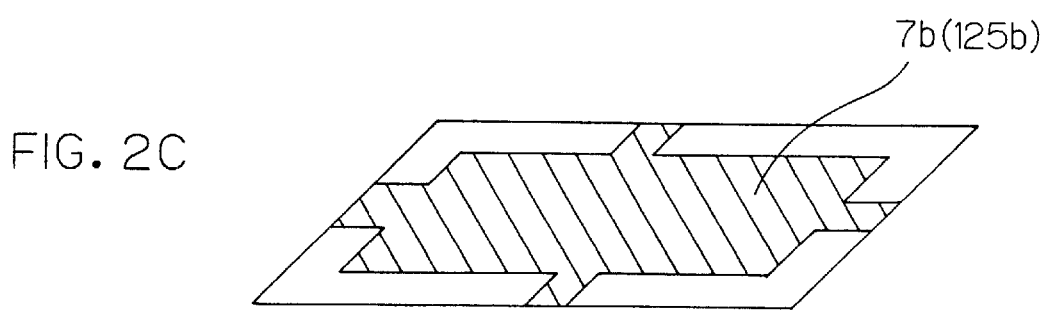

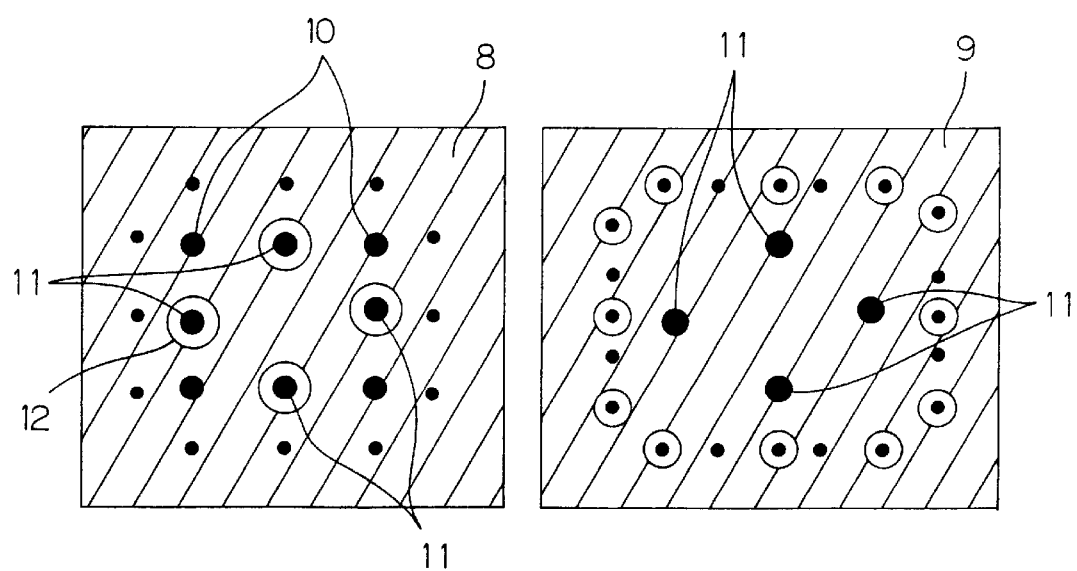

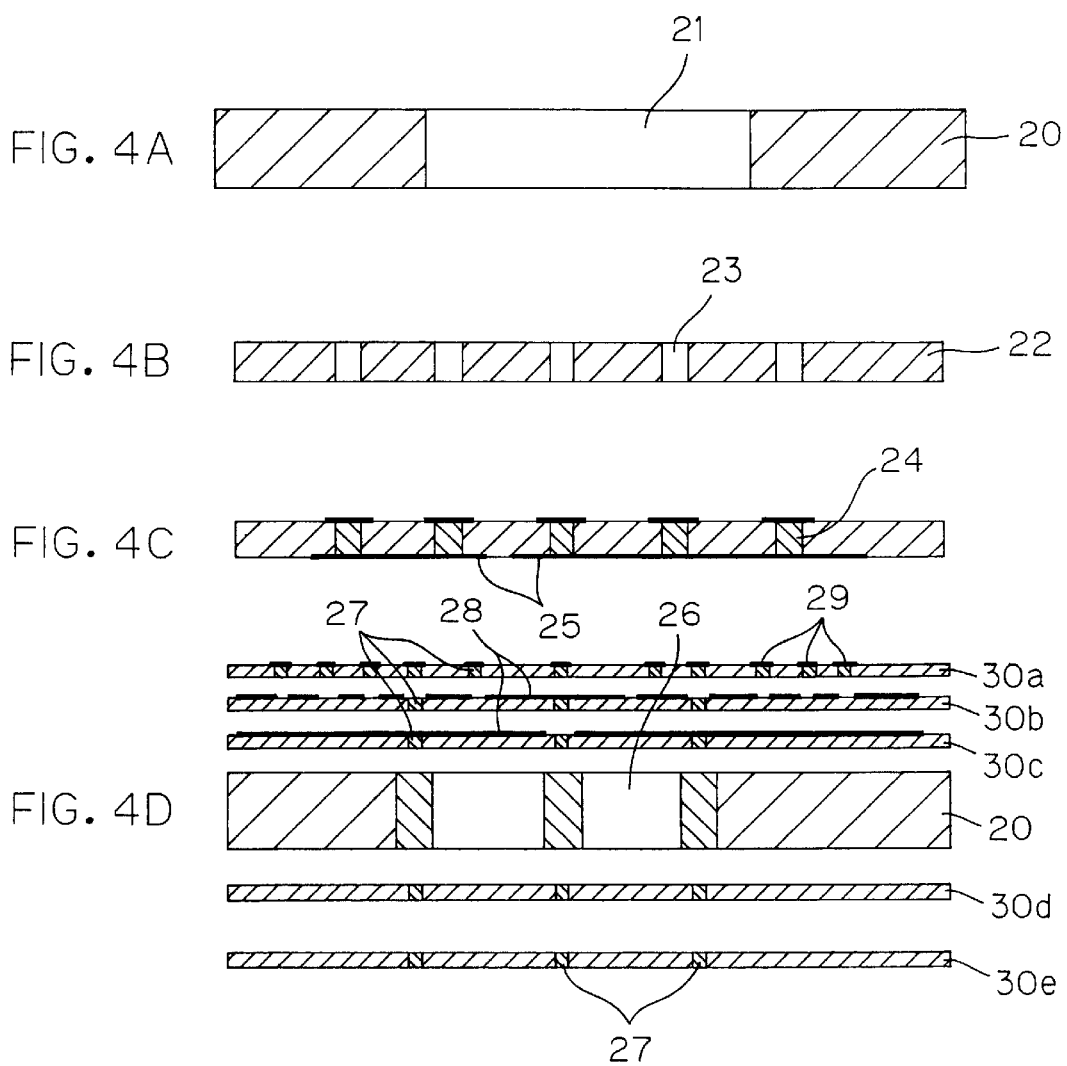

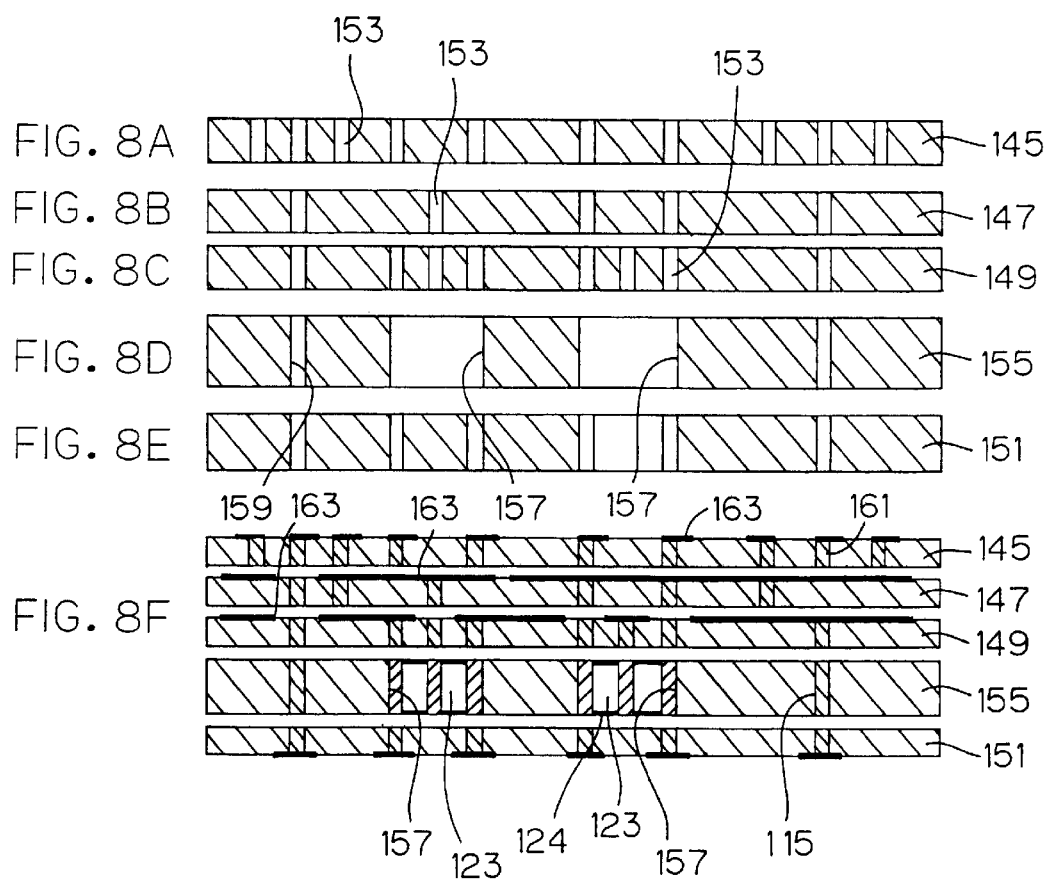

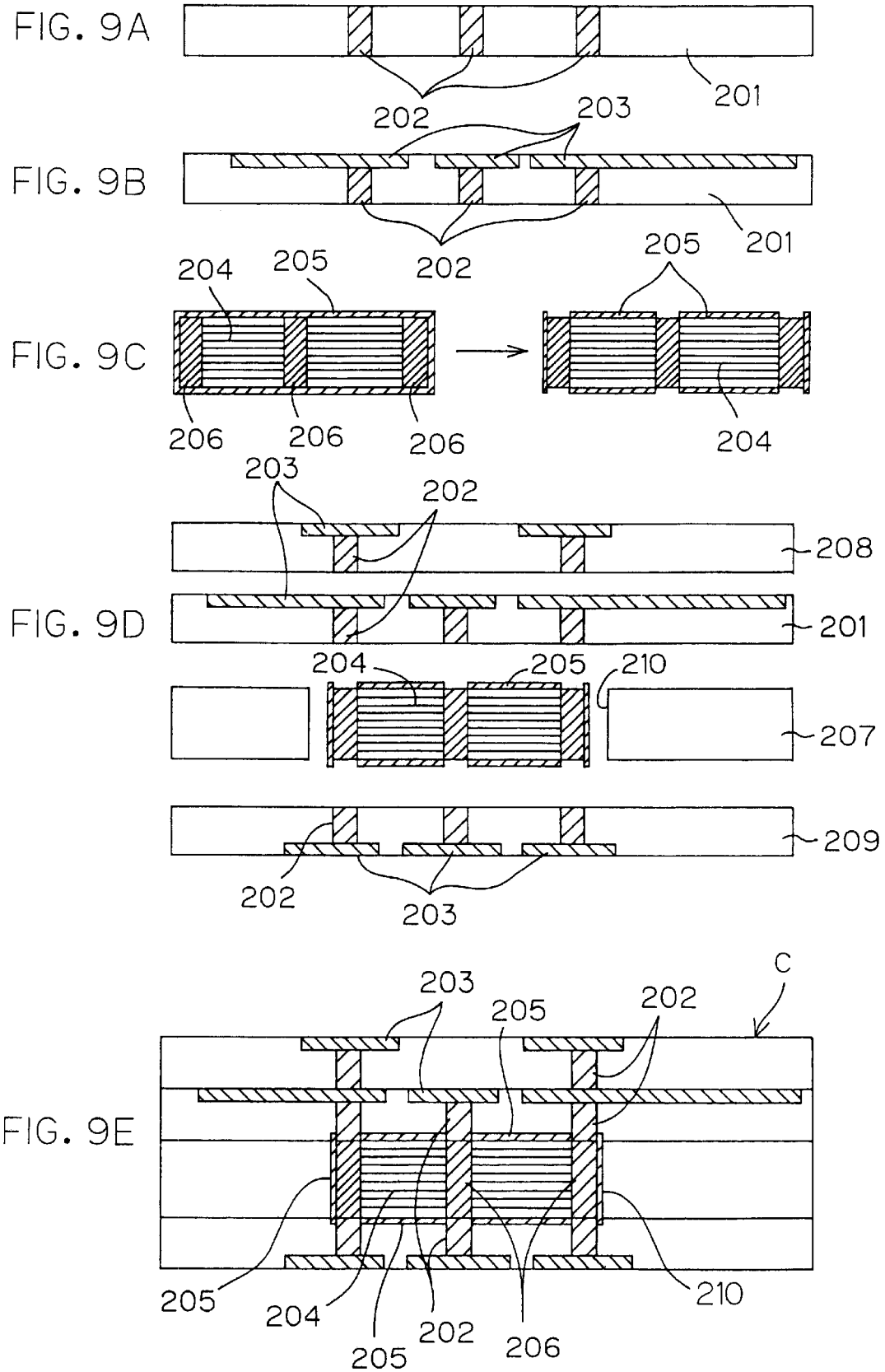

ELECTRIC ELEMENT INCORPORATING WIRING BOARD

BACKGROUND OF THE INVENTION

1. Field of the Invention

The present invention relates to a wiring board where on electronic components such as LSI chips are mounted on the surface thereof and, more particularly, to a low-impedance wiring board having an electric element such as a capacitor incorporated in the wiring board.

2. Description of Related Art

Recently, as telecommunication apparatuses proliferate, electronic equipment operating at a high speed is increasingly used and accordingly demands for electronic packages capable of operating at high speeds are increasing. In order for a high speed operation, noises on electric signals must be minimized. This requires that passive electronic components such as capacitors be placed in proximity to active electronic components and that the wiring length of electronic circuits be minimized, thereby to reduce the inductance of the interconnection lines.

For example, Japanese Unexamined Patent Publication (Kokai) No. 7-142871 (1995) proposes that a bypass capacitor is formed between a planar pattern drawn from a power supply layer and a planar pattern drawn from ground layer. In this constitution, however, electromagnetic field concentrates in a small number of via hole conductors that are connected to a power supply layer formed inside of the wiring board or the planar electrode used to lead from the ground layer. There is also such a problem that increasing the number of the via hole conductors used in interconnection leads to a decrease in the capacity of the dielectric layer.

Japanese Unexamined Patent Publication (Kokai) No. 10-92966 (1998) proposes that a chip capacitor is mounted near a cavity wherein a semiconductor device is hermetically sealed, whereby the chip capacitor is disposed as near to the semiconductor device as possible. However, since the capacitor is mounted in portions different from the portion where the semiconductor device is wired, wiring length increases, resulting in increasing value of inductance. That is, connection between the capacitor and the semiconductor device requires it to make wiring through the via hole conductors and the wiring circuit formed in the dielectric substrate.

In Japanese Unexamined Patent Publication (Kokai) No. 11-220262 (1999), such a wiring board is proposed as all insulation layers that constitute a dielectric substrate are formed from a mixture including an inorganic filler and a thermosetting resin, in relation to a module incorporating circuit components and a method of producing the same. However, this circuit board has such a problem as the weak mechanical strength and low rigidity of the board cause the wiring board to deform with a flip chip portion warping, when the semiconductor device is mounted on the surface of the wiring board by flip chip mounting procedure.

Moreover, for example, Japanese Unexamined Patent Publication (Kokai) No. 2-121393 (1990) proposes to embed a chip capacitor in an insulation layer between a power supply layer and a ground layer. In Japanese Unexamined Patent Publication (Kokai) No. 11-220262 (1999) and Japanese Unexamined Patent Publication (Kokai) No. 10-51150 (1998) such wiring boards are proposed as semiconductor devices and capacitors are incorporated in a dielectric substrate.

In the constitution disclosed in Japanese Unexamined Patent Publication (Kokai) No. 2-121393 (1990), ceramic chip capacitors embedded in an insulation layer between a power supply layer pattern and a ground layer pattern are supported by the surrounding insulation layers. However, connections between the terminal electrodes of the capacitor, power supply layer in the substrate and the ground layer are made by pressure contact. As a result, when subjected to a thermal shock, the connection performance between the terminal electrode and the wiring circuit layer changes due to the difference in the thermal expansion coefficient.

Japanese Unexamined Patent Publication (Kokai) No. 11-220262 (1999) also proposes to connect the electrodes of a semiconductor device and a wiring circuit layer by means of a conductor such as gold, silver, copper, nickel or solder. However, in the case that an electronic component such as semiconductor device is soldered onto the surface of a wiring board, there has been such a problem that the connection performance between the terminal electrode and the wiring circuit layer changes when the solder is reflowed at a temperature from 220 to 300° C. Where the component incorporated inside is a capacitor, in particular, inductance due to the capacitor increases, thus leading to a change or deterioration of the function of the capacitor to remove noise.

Moreover, in the capacitor incorporating wiring board of the prior art described in for example, Japanese Unexamined Patent Publication (Kokai) No. 2-121393 (1990), Japanese Unexamined Patent Publication (Kokai) No. 11-220262 (1999) or Japanese Unexamined Patent Publication (Kokai) No. 10-51150 (1998), there is a problem of low reliability of connection between the capacitor and the wiring circuit layer on the wiring board when thermal cycles or stress is exerted thereon.

Such a method has been proposed for fastening a capacitor on a wiring board that a clearance between the capacitor and an insulation layer is filled with a thermosetting resin and the thermosetting resin is hardened together with the insulation layer thereby to bond firmly.

However, since the capacitor has lower thermal expansion coefficient than the insulation layer, the capacitor is subjected to stress when thermal cycles are applied. The stress may damage the capacitor or impair the reliability of the connection thereof with the wiring circuit layer.

In the case of for example, Japanese Unexamined Patent Publication (Kokai) No. 11-220262 (1999), although a constitution of incorporating semiconductor device and/or chip electric components in a wiring board is described, there is no description on a relation with via hole conductors of the wiring board or the conductor layer where an electric circuit is to be formed, or on the relation between the via hole conductors connected to a plurality of electric components. For example, in the case that via holes where currents flow in the same direction are located close to each other, the effect of the mutual inductance of the two via hole conductors becomes conspicuous particularly when a signal of high frequency is transmitted, resulting in an increase in the inductance of the wiring.

SUMMARY OF THE INVENTION

A first object of the present invention is to provide a constitution of a wiring board that reduces the generation of noise due to high speed operation of electronic components and effectively decreases the inductance due to electric elements disposed near an electronic components.

A second object of the present invention is to provide a wiring board that incorporates electric elements such as capacitors inside a dielectric substrate thereof, and ensures excellent performance and reliability of mounting components even in the case of flip-chip mounting of electronic components such as semiconductor devices on the surface of the substrate.

A third object of the present invention is to provide an electric element incorporating wiring board having excellent reliability of connection between electric elements incorporated inside thereof and a wiring circuit layer formed on the wiring board.

A fourth object of the present invention is to provide an electric element incorporating wiring board that incorporates electric elements such as capacitors inside a dielectric substrate thereof, and maintains connection between the electric elements incorporated inside thereof and a wiring circuit layer formed on the wiring board with such an excellent reliability that the functions of the incorporated electric elements does not change after reflow of solder for mounting electronic components on the surface.

The present inventors have intensively studied about the electric element incorporating wiring board that incorporates electric elements inside an dielectric substrate thereof, and has electronic components mounting surface on the dielectric substrate, for achieving the objects described above. Consequently, the present inventors arrived at such a constitution as an electric element having at least two first terminal electrodes and at least two second terminal electrodes is used as an electric element incorporated in a dielectric substrate, a first and a second electrically conductive layer are formed inside of the dielectric substrate disposed between the electric element and the surface of the dielectric substrate, all of the first terminal electrodes of the electric element are connected to the first conductive layer and all of the second terminal electrodes of the electric element are connected to the second conductive layer, while via hole conductors that penetrate through the first and the second conductive layers are formed to reach the surface of the dielectric substrate, and the via hole conductors and an electronic component such as semiconductor device mounted on the board surface are electrically connected to each other.

Thickness of the insulation layer disposed between the conductive layer and the dielectric substrate surface is preferably 0.3 mm or less.

In case a capacitor having two or more positive terminal electrodes and two or more negative terminal electrodes is used as the electric element, for example, the capacitor itself has a low inductance. When connecting the low-inductance capacitor and the electronic component, the positive terminal electrodes and the negative terminal electrodes of the capacitor are each connected to one of the conductive layers, while the conductive layer and the electronic component are connected through the via hole conductors. Since the distance between the conductive layer and the electronic component can be decreased by decreasing the thickness of the insulation layer disposed between the conductive layer and the board surface, the inductance can be effectively reduced.

The dielectric substrate is preferably made in a laminated structure comprising a first insulation layer made of a mixture of a thermosetting resin and an inorganic filler and a second insulation layer made of a fibrous material impregnated with a thermosetting resin. In this case, it is preferable that the electric element is incorporated in the first insulation layer and the difference in the thermal expansion coefficient between the electric element and the first insulation layer is $7 \times 10^{-6}/°$ C. or less. It is also preferable that the second insulation layer is located at the top surface of the dielectric substrate.

Thermal expansion coefficient of the first insulation layer made of the mixture of the thermosetting resin and the inorganic filler can be easily altered by properly selecting the type and quantity of the filler. Thus the thermal expansion coefficient of the first insulation layer can be easily matched to that of the electric element to be embedded in the first insulation layer. Thus it is made possible to suppress the stress caused by the difference in the thermal expansion coefficient, and thereby minimizing the deformation of the wiring board and improve the reliability of connection between the wiring circuit layer of the wiring board and the electric element.

On the other hand, when the dielectric substrate is made of only the first insulation layer made of the mixture of the thermosetting resin and the inorganic filler, the substrate has a lower strength as a whole and the surface flatness is likely to be impaired. Therefore the second insulation layer made of the fibrous material impregnated with the thermosetting resin is stacked on the top or bottom surface of the insulation layer made of the mixture of the thermosetting resin and the inorganic filler. This increases the strength of the first insulation layer and, at the same time, improves the flatness of the wiring board surface, thereby achieving the wiring board that can be used satisfactorily even when semiconductor devices are mounted by flip chip bonding.

It is also preferable that terminal electrodes of the electric element and the via hole conductors are directly connected to each other, and the junctions between the terminal electrodes and the via hole conductors include an intermetallic compound of Cu and Sn. In this case, the via hole conductor preferably includes Cu and Sn as metallic components. Proportion of Sn to the total metal component (Cu+Sn) by weight is preferably in a range from 0.5 to 0.95. Further, an electrically conductive layer including at least Sn is preferably formed on the top surface of the terminal electrodes of the electric element.

Specifically, a Sn-containing conductive layer is formed on the top surface of the terminal electrodes of the electric element, and the via hole conductors are caused to contain Cu and Sn, and the board is heated to a temperature of 210° C. or higher. This causes the metallic component based on Cu and Sn included in the via hole conductors and the Sn component of the terminal of the electric element to react with each other, so that intermetallic compounds of Cu and Sn such as $Cu_3Sn$ or $Cu_6Sn_5$ that are excellent in the electrical conductivity and in heat resistance are formed, in addition to Cu and Sn, in the junctions between the via hole conductors and the terminal electrodes of the electric element. As a result, electrical connection between the via hole conductors and the terminal of the electric element can be improved. Consequently, even when subjected to sudden heating from the outside due to solder reflow or the like, the connection performance between the terminal electrodes and the via hole conductors does not change. Thus it is made possible to prevent the inductance of the electric element from increasing and achieve stable function.

Reliability of connection can be improved further by making the area of the connecting surface of the terminals of the electric elements with the via hole conductors larger than the sectional area of the via hole conductor.

In the electric element incorporating wiring board described above, the capacitor used as the electrical element can be caused to function as a decoupling capacitor. Thus switching noise generated in the operation of the semiconductor device mounted on the wiring board can be effectively reduced.

A plurality of capacitors can be incorporated in the electric element incorporating wiring board. In this case, it is preferable to incorporate capacitors of different values of capacitance. This makes it possible for the plurality of capacitors having different resonant frequencies to function in an integrated form, and results in the capability to achieve low impedance in a wider range and keep the inductance lower over wider frequency band.

In case a plurality of electric elements are incorporated in the dielectric substrate, it is preferable to connect a pair of via hole conductors, that are most proximate to each other between adjacent electric elements, to different conductive layers among the first and second conductive layers, so that currents flow in different directions in the via hole conductors. Since the mutual inductance of the interconnection including the via hole conductors can be decreased in this configuration, the electric elements can be mounted with a higher density. A wiring board having a low inductance can be achieved even when the space between a pair of via hole conductors that are most proximate to each other between adjacent electric elements is set to 0.5 mm or less.

The surface of the electric element other than the first and second terminal electrodes is preferably covered by a thermoplastic resin that has glass transition point not higher than 100° C. This makes it possible to maintain high reliability of connection between the electric elements and the wiring layer even when the wiring board is subjected to thermal shock due to thermal cycles or solder reflow.

The above objects and other objects, features and effects of the present invention will become more apparent by the description of preferred embodiments that follows with reference to the accompanying drawings.

BRIEF DESCRIPTION OF THE DRAWINGS

FIG. 2A is a schematic perspective view of a capacitor used as an example of electric element in one embodiment of the present invention, FIG. 2B shows a pattern of internal electrode for positive electrode thereof, and FIG. 2C shows a pattern of internal electrode for negative electrode thereof.

FIG. 3A shows a pattern of the first conductive layer formed inside of the wiring board of FIG. 1, and FIG. 3B shows a pattern of the second conductive layer formed inside of the wiring board thereof.

FIGS. 4A to 4D show processes of producing the wiring board of FIG. 1.

FIGS. 8A to 8F are sectional views schematically showing processes of producing the electric element incorporating wiring board of FIG. 5.

FIGS. 9A to 9E are sectional views schematically showing processes of producing the electric element incorporating wiring board according to another embodiment of the present invention.

DESCRIPTION OF THE PREFERRED EMBODIMENTS

Embodiment 1

Figure 1:
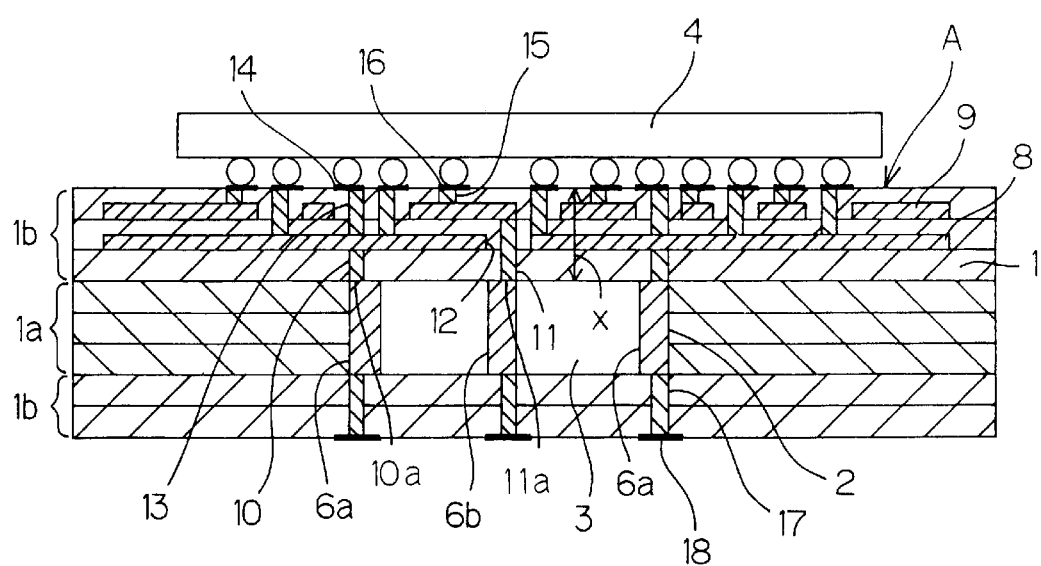
FIG. 1 is a sectional view schematically showing an electric element incorporating wiring board according to one embodiment of the present invention.

FIG. 1 is a sectional view schematically showing an electric element incorporating wiring board according to one embodiment of the present invention. A wiring board A has a dielectric substrate 1 having a cavity 2 formed inside thereof, and a capacitor 3 as an example of an electric element incorporated in the cavity 2. Mounted on the surface of the wiring board A right above the capacitor 3 is a semiconductor device 4 as an electronic component.

The capacitor 3 incorporated in the dielectric substrate 1 has at least two positive electrodes and at least two negative electrodes. An example of the capacitor 3 is shown in the schematic perspective view of FIG. 2A. The capacitor 3 of FIG. 2A has a capacitor body 3a of rectangular parallele piped shape formed by laminating ceramic dielectric layers 5 including $BaTiO_3$ as a major component. Formed on the external surface of the capacitor body 3a are four positive terminal electrodes 6a and four negative terminal electrodes 6b, indicated by hatches in the drawing, being disposed independently and equally spaced thereon. In the capacitor 3 of FIG. 2A, the negative terminal electrodes 6b are formed at the middle of each side and the positive terminal electrodes 6a are formed at the corners.

Also formed between the ceramic dielectric layers 5 of the capacitor body 3a are an internal electrode for positive electrode 7a (indicated by hatch) having the pattern shown in FIG. 2B and an internal electrode for negative electrode 7b (indicated by hatch) having the pattern shown in FIG. 2C that are formed alternately. The internal electrode for positive electrode 7a is electrically connected to the positive terminal electrode 6a and the internal electrode for negative electrode 7b is electrically connected to the negative terminal electrode 6b at the end faces of the capacitor body 3a.

Formed in the dielectric substrate 1 between the electronic component mounting surface and the capacitor 3 incorporated therein are a first conductive layer 8 and a second conductive layer 9 being insulated from each other. The first conductive layer 8 is, as shown in the pattern diagram of FIG. 3A, electrically connected to the four positive terminal electrodes 6a of the capacitor 3 through the via hole conductors 10 formed to penetrate through the insulation layer right above the positive terminal electrodes 6a.

Similarly, the second conductive layer 9 is, as shown in the pattern diagram of FIG. 3B, electrically connected to the four negative terminal electrodes 6b of the capacitor 3 through the via hole conductors 11 formed to penetrate through the insulation layer right above the negative terminal electrodes 6b.

Formed in the first conductive layer 8 is an aperture 12 wherein an electrical conductor is formed so as not to make contact with the via hole conductors 11 that connect the negative terminal electrode 6b and the second conductive layer 9.

Further formed on the first conductive layer 8 connected with the positive terminal electrodes 6a of the capacitor 3 is a via hole conductor 13 extending to the semiconductor device mounting surface. The via hole conductor 13 is connected with a positive terminal electrode land 14 provided on the board surface. Similarly formed on the second conductive layer 9 connected with the negative terminal electrodes 6b of the capacitor 3 is a via hole conductor 15 extending to the semiconductor device mounting surface. The via hole conductor 15 is connected with a negative electrode land 16 provided on the board surface.

Bumps of the semiconductor device 4 mounted on the surface of the dielectric substrate 1 are electrically connected to the positive electrode land 14 and the negative electrode land 16.

According to this embodiment, a capacitor having a plurality of positive electrodes and negative electrodes is used as the capacitor 3 to be incorporated in the wiring board A. This constitution decreases the inductance in comparison to a case of an ordinary capacitor having one positive electrode and one negative electrode. This is because the electromagnetic field is prevented from concentrating in the electrode.

Thus the constitution of this embodiment is made by, after collecting the plurality of positive terminal electrodes 6a and the negative terminal electrodes 6b of the capacitor 3 through the via hole conductors 10, 11 to the conductive layers 8, 9, the via hole conductors 13, 15 lead from the conductive layers 8, 9, respectively, to the surface of the board. This constitution decreases the inductance in comparison to a case of leading directly from the positive terminal electrodes 6a and the negative terminal electrodes 6b of the capacitor 2 to the substrate surface by means of the via hole conductors. This is because the electromagnetic field concentrated in the via hole conductors is distributed over the flat conductive layer.

Wiring length between the semiconductor device 4 and the capacitor 3 can be decreased by decreasing the thickness of the insulation layer located above the capacitor 3 in the constitution described above. This decreases the inductance further.

Specifically, the inductance can be decreased effectively by setting the thickness x of the insulation layer formed above the capacitor 3, or the depth of the capacitor 3 from the substrate surface, to 0.3 mm or less.

As shown in FIG. 1, pads 18 are provided on the bottom face side of the capacitor 3 incorporated in the wiring board A, the pads 18 being connected to the terminal electrodes 6 of the capacitor 3 via the via hole conductors 17. The pads 18 can be connected to the power source.

The dielectric substrate 1 of the capacitor incorporating wiring board may be made of either a sintered ceramic insulation material or an organic insulation material that includes at least an organic resin as the insulating component, as long as the structure incorporating the capacitor as described above can be formed. However, an organic insulation material that does not need sintering process is preferable in order to form such a structure as the capacitor 3 having a plurality of electrodes that are formed in advance is embedded in the substrate.

Now a method of producing the capacitor incorporating wiring board wherein the dielectric substrate is made of the organic insulation material described above will be described below.

First, an uncured insulation sheet made of a thermosetting resin such as epoxy resin or polyphenylene ether resin, or made of a mixture of the thermosetting resin and a ceramic powder such as silica or alumina, or a prepreg in uncured state made of woven fabric or nonwoven fabric of glass fiber or aramid fiber impregnated with a thermosetting resin such as epoxy resin is prepared.

As shown in FIGS. 4A to 4D, a cavity 21 for housing the capacitor is formed by punching or the like in the prepreg 20 (FIG. 4A). Meanwhile via holes 23 are formed in an insulation sheet 22 by laser machining, and the via holes 23 are filled with an electrically conductive paste that includes a conductive powder such as Cu powder, thereby to form via hole conductors 24 (FIG. 4B). Then a conductive layer 25 is formed on the surface of the insulation sheet 22 (FIG. 4C). The conductive layer 25 is formed by, for example, adhering a metal foil such as Cu foil or Al foil onto the surface of the insulation sheet, and then carrying out the processes of application of a resist, exposure to light, development, etching and removal of the resist thereby forming a predetermined pattern. Alternatively, the conductive layer 25 may also be formed by transferring a conductive layer of the predetermined pattern, that is formed similarly to the above by adhering a metal foil on the surface of a resin film, onto the surface of the insulation sheet. Among these, the latter method is preferable because the insulation sheet is not exposed to an etching solution and therefore does not deteriorate.

Then a capacitor 26 is placed in the cavity of the prepreg 20, and insulation sheets 30a, 30b, 30c, 30d, 30e, that have pads 29 for the connection with the via hole conductors 27, the conductive layer 28 and a semiconductor device formed thereon, are laminated on top and bottom of the prepreg 20 by applying the production process described above (FIG. 4B, FIG. 4C). The laminate is heated to a temperature that is high enough to harden the thermosetting resin included in the insulation sheet and in the prepreg, thereby to produce the wiring board having the capacitor incorporated therein as shown in FIG. 1.

In order to make reliable electrical connection between the positive and the negative electrodes of the capacitor 26 mounted in the prepreg 20 and the via hole conductors of the insulation sheet, it is preferable to apply a solder, that can be melted at the thermal setting temperature, onto the junction between the via hole conductors and the capacitor and/or the surfaces of the positive electrode and the negative electrode of the capacitor.

Embodiment 2

Now second embodiment of the present invention will be described below with reference to FIG. 1 to FIGS. 4A–4D. Since the second embodiment is similar to the first embodiment described above, description that follows will center around the difference from the first embodiment while minimizing repeated description.

In this embodiment, the dielectric substrate 1 of the wiring board A comprises a first insulation layer 1a (hereinafter referred to simply as CPC layer) having a portion made of a mixture of a thermosetting resin and an inorganic filler for housing the capacitor 3. Second insulation layer 1b (hereinafter referred to as prepreg) made by impregnating at least one layer of fabric with the thermosetting resin is laminated on the front surface of the dielectric substrate 1 whereon the semiconductor device 1 is to be mounted and/or the back surface whereon connection terminals such as solder ball pads or connecting pins are to be provided.

CPC Layer

The CPC layer 1a where the capacitor 3 is to be embedded is made of a composite material consisting of the thermosetting resin and the inorganic filler. For the inorganic filler, for example, at least one kind of material selected from $SiO_2$, $Al_2O_3$, AlN and $Si_3N_4$ may be preferably used. The inorganic filler is preferably included in a proportion of 35 to 70% by volume with respect to the thermosetting resin. Mean particle size of the inorganic filler is most preferably in a range from 1.0 to 20 μm. The CPC layer has thickness in a range from 50 to 150 μm per layer, and is formed to a predetermined thickness by laminating a proper number of layers in accordance to the size of the electric element such as capacitor to be incorporated.

The CPC layer is preferably made to have difference in the thermal expansion coefficient from the electric element to be embedded not larger than $7 \times 10^{-6}$/° C. in a temperature range from −65 to 250° C., particularly not larger than $5.5 \times 10^{-6}$/° C. When there is a large difference in the thermal expansion coefficient, an intense stress is generated to cause the wiring board to deform. This makes flip chip mounting difficult to carry out, and makes the connection between the electric element and the wiring layer of the wiring board unreliable, resulting in a possibility that the electric element cannot function properly.

Prepreg Layer

The prepreg layer 1b is made of a fabric impregnated with the thermosetting resin. Thickness of one layer is about 150 μm or less, including 40 to 60% by volume of the fabric and 60 to 40% by volume of the thermosetting resin.

The fabric is made of at least one kind selected from a group of glass and aramid resin. Diameter of the fiber is preferably 10 μm or less in order to ensure mechanical strength.

While the fiber may be distributed uniformly, it is preferably made in the form of woven fabric or nonwoven fabric in order to ensure rigidity of the substrate.

For the thermosetting resin included in the CPC layer and the prepreg layer, at least one kind selected from APP (allylated polyphenylene ether) resin, epoxy resin and cyanate resin is preferably used. The APP resin is particularly preferred for the low relative dielectric constant, low dielectric loss, low water absorption and high heat resistance due to a high glass transition point thereof. The mixture may also include a dispersant and/or coupling agent in order to improve the wettability with the filler.

The first conductive layer 8 and the second conductive layer 9 are formed on the prepreg layer 1b disposed between the capacitor 3 and the electronic component mounting surface.

Production Process

For producing the electric element incorporating wiring board of this embodiment, an insulation sheet in uncured state made of a mixture of a thermosetting resin such as epoxy resin or polyphenylene ether resin and a ceramic powder such as silica or alumina is fabricated as an insulation sheet for forming the CPC layer. As the prepreg layer insulating sheet, an insulation sheet in uncured state made by impregnating woven fabric or nonwoven fabric of glass fiber or aramid fiber with a thermosetting resin such as epoxy resin is fabricated.

Then the electric element incorporating wiring board is produced through processes similar to the production processes of the first embodiment shown in FIGS. 4A to 4D. However, the prepreg 20 is replaced with the CPC layer insulation sheet and the prepreg layer insulating sheet is used for the insulation sheets 22, 30a, 30b, 30c, 30d, 30e.

Embodiment 3

Now the third embodiment of the present invention will be described below with reference to FIG. 1 to FIGS. 4A–4D. Since the third embodiment is similar to the first embodiment described above, description that follows will center around the difference from the first embodiment while minimizing repeated description.

This embodiment is characterized in that an intermetallic compound of Cu and Sn is caused to exist at least in the junctions 10a, 11a (FIG.1) between the positive terminal electrodes 6a and the negative terminal electrodes 6b of the capacitor 3 in the wiring board A and the via hole conductors 10, 11 that are connected directly with the former. The intermetallic compound has a high heat resistance and a high electrical conductivity. Consequently, even when subjected to thermal cycles applied from the outside, connection between the terminal electrodes 6a, 6b of the capacitor 3 and the via hole conductors 10, 11 can be maintained firmly. The intermetallic compound of Cu and Sn may be $Cu_3Sn$ that includes copper (Cu) and tin (Sn) in the proportion of 3:1 or $Cu_6Sn_5$ with the proportion of 6:5.

When at least $Cu_3Sn$ that includes copper in higher proportion is included, higher heat resistance and higher electrical conductivity can be given to the via hole conductors. It is particularly desirable that the intermetallic compound includes $Cu_3Sn$ or both $Cu_3Sn$ and $Cu_6Sn_5$. More specifically, peak height H1 of $Cu_3Sn$ located near $2\theta=57.5°$ and peak height H2 of $Cu_6Sn_5$ located near $2\theta=60°$, measured in X ray diffraction analysis of the via hole conductors 10, 11 satisfy such a relation of inequality as the ratio H1/H2 is 0.5 or higher, especially 1.0 or higher.

It suffices that the intermetallic compound exists at least in the junctions between the terminal electrodes 6a, 6b of the capacitor 3 and the via hole conductors 10, 11. It is particularly preferable that the intermetallic compound exists in the via hole conductors 10, 11 including the junctions. This not only improves the reliability of connection between the via hole conductors 10, 11 and the terminal electrodes 6a, 6b but also improves the heat resistance and electrical conductivity of the via hole conductors 10, 11. Thus it is made possible to improve the stability of connection between the terminal electrodes 6a, 6b of the capacitor 3 and other circuits through the via hole conductors 10, 11.

In order to produce the intermetallic compound, it is desirable that at least the junctions of the via hole conductors 10, 11 with the terminal electrodes 6a, 6b include Cu and Sn as metal components. In this case, proportion of copper (Cu) and tin (Sn) contents is desirably such that weight ratio Sn/(Cu+Sn) is in a range from 0.5 to 0.95. It is also desirable for the reason described previously, that Cu and Sn of the proportions described above are included in the entire via hole conductors 10, 11. Moreover, in order to promote the generation of $Cu_3Sn$, weight ratio Sn/(Cu+Sn) is preferably in a range from 0.5 to 0.75, particularly from 0.5 to 0.70, and more preferably from 0.5 to 0.65.

When the weight proportion is less than 0.5, less amount of intermetallic compound is generated which results in lower connectivity between powder particles including copper and between the copper-containing powder and the terminal electrodes of the capacitor. This leads lower electrical conductivity with the semiconductor device mounted on the surface through the via hole conductors and with the mother board. Moreover, the contact state between metal powder particles and between the via hole conductors and the terminal electrodes of the capacitor can easily change, resulting in lower electrical conductivity therebetween, in the case of solder reflow particularly at a temperature in a range from 240 to 260° C.

When the weight proportion is higher than 0.95, copper content decreases and therefore less amount of the intermetallic compound is produced. In addition, tin atoms that have not react with Cu to form the intermetallic compound remain unchanged or form a tin alloy of low melting point. As a result, heat resistance tends to deteriorate during solder reflow (240 to 260° C.), with the unreacted tin and the tin alloy of low melting point melt during solder reflow. Consequently, the contact state between metal powder particles and between the via hole conductors and the terminal electrodes of the capacitor can easily change resulting in lower electrical conductivity therebetween.

The via hole conductor may also include a thermosetting resin such as epoxy resin, phenol resin and unsaturated polyester resin, or cellulose.

Capacitor Electrodes

In order to improve the connection with the via hole conductors 10, 11 including Cu and Sn as the metal component, it is desirable that there is a conductive layer that includes at least Sn formed on the top surface of the terminal electrodes 6a, 6b of the electric elements such as capacitor 3. It is particularly desirable to form a conductive layer which includes at least one kind of Cu or Ni and a conductive layer which includes at least Sn on the surface of the former conductive layer.

Specifically, the terminal electrodes 6a, 6b of the capacitor 3 are formed as follows. First, electrolytic copper powder having mean particle size of 1 to 5 $\mu$m and frit glass powder made of $SiO_2$, $Bi_2O_3$, $Al_2O_3$, ZnO or the like having mean particle size of 3 to 8 $\mu$m are prepared. A conductive paste is made by mixing the frit glass powder with ethyl cellulose or acrylic binder. The conductive paste is applied to cover the internal electrode exposed on the end face of the capacitor, and is fired at a temperature in a range from 800 to 900° C. Thus a electrode layer having a thickness of 3.0 to 15 $\mu$m is formed.

Then a Ni film 1 to 5 $\mu$m thick and an Sn film 0.5 to 3 $\mu$m thick are formed by electroplating on the surface of the electrode layer.

When the conductive layer including Sn is formed on the surfaces of the terminal electrodes 6a, 6b, generation of Cu—Sn intermetallic compound in the junction with the via hole conductors that include at least Cu and Sn can be promoted.

The Cu—Sn intermetallic compound generated in the junctions of the via hole conductors 10, 11 and the terminal electrodes 6a, 6b ensures excellent electrical conductivity. To be specific, after heat resistance test of keeping the temperature at 260° C. for two minutes, resistivity of the junction between the via hole conductors 10, 11 and the capacitor can be kept within $1\times10^{-4}$ $\Omega \cdot cm$, or even within $5\times10^{-5}$ $\Omega \cdot cm$.

When producing the electric element incorporating wiring board of this embodiment, a conductive paste that forms the via hole conductors is made as follows in order to produce the Cu—Sn intermetallic compound in the junction with the capacitor. First, copper-containing powder such as copper powder, copper powder covered by silver powder or copper-silver alloy powder is mixed with tin powder or alloy powder made from Sn—Ag—Cu—Bi. Mix proportion of copper (Cu) and tin (Sn) contents is set so that weight ratio Sn/(Cu+Sn) is in a range from 0.5 to 0.95. 1 to 6 parts by weight of resin and 1 to 4 weight parts of solvent are added to 100 parts by weight of the metallic component.

For the copper-containing powder, it is most desirable to use electrolytic copper powder that has excellent conductivity and good dispersibility with the mean particle size being desirably in a range from 0.5 to 5 $\mu$m. When the mean particle size is less than 0.5 $\mu$m, the surface is oxidized resulting in lower conductivity. When the mean particle size is larger than 5 $\mu$m, filling ratio of the powder in the via hole conductor decreases, resulting in higher resistivity.

Mean particle size of the tin powder or tin alloy powder is preferably in a range from 1 to 15 $\mu$m. When the mean particle size is less than 1 $\mu$m, the surface is oxidized resulting in higher resistance. When the mean particle size is larger than 15 $\mu$m, filling ratio decreases and the distribution of tin is localized resulting in lower heat resistance.

For the resin component, polymethacrylate or cellulose may be used as well as thermosetting resin such as bisphenol A, bisphenol F, epoxy resin and triallyl isocyanate resin that react with amine curing agent or acid anhydride may be used, in consideration of dispersibility, bonding characteristic, heat resistance, storage stability and weathering resistance.

The solvent is required only to be capable of dissolving resin and maybe, for example, isopropyl alcohol, terpineol, 2-octanol, butylcarbitol acetate or the like.

The mixture prepared as described above is kneaded by a degassing mixer or a 3-roll mixer, thereby to make a paste. This kneading operation mixes the metal powder and the thermosetting resin, so as to prevent the tin-based powder from being oxidized during curing.

The capacitor 26 having the terminal electrodes whereon the conductive layer including Sn is formed on the top surface is mounted in the cavity 21 of the prepreg 20. Then the insulation sheets 30a, 30b, 30c, 30d, 30e whereon the via hole conductors 27 formed by filling Cu and Sn as the metal component, conductive layer 28 and pads 29 for the connection with the semiconductor device are formed, are laminated on top and bottom of the prepreg 20.

This laminate is heated at a temperature which is high enough to harden the thermosetting resin included in the insulation sheet and in the prepreg, thereby to make the wiring board incorporating the capacitor as shown in FIG. 1.

In order to have the Cu or Sn included in the via hole conductor and Sn included in the terminal electrode of the capacitor 3 to react with each other and form the Cu—Sn intermetallic compound, this heating operation is carried out at 200 to 250° C. for a period of 0.5 to 5 hours, preferably for 1 to 3 hours. This causes the intermetallic compound consisting of $Cu_3Sn$ or $Cu_6Sn_5$ to be generated.

Embodiment 4

Structure of Wiring Board

Figure 5:
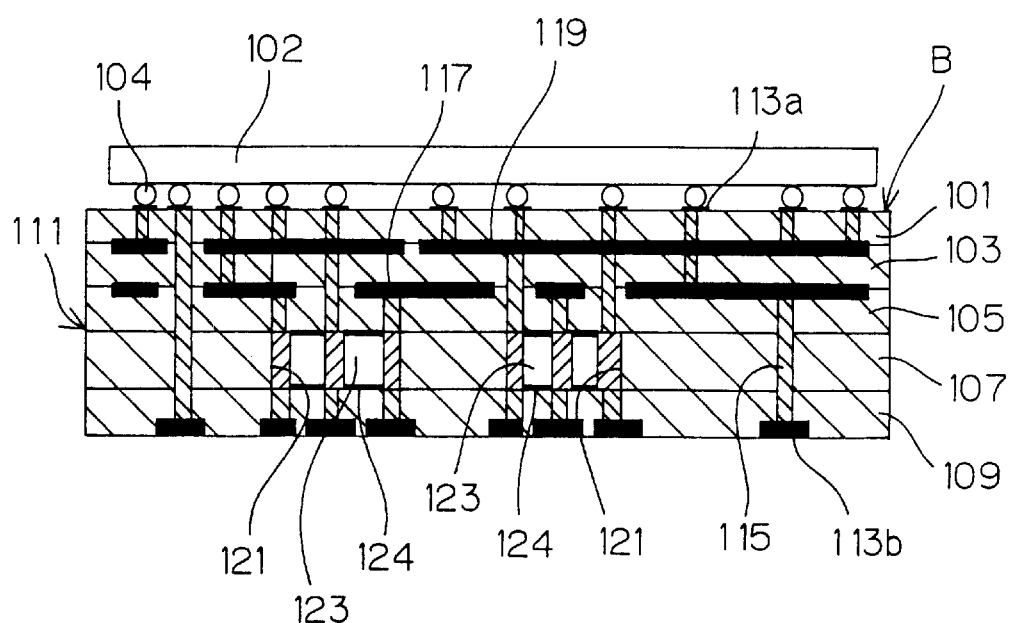
FIG. 5 is a sectional view schematically showing an electric element incorporating wiring board according to another embodiment of the present invention.

FIG. 5 is a schematic sectional view of a wiring board B according to the fourth embodiment of the present invention. The wiring board B is made by forming wiring circuit layers 113a, 113b on both surfaces of a dielectric substrate 111 that is formed by laminating five insulation layers 101, 103, 105, 107, 109. The insulation layers 101, 103, 105, 107, 109 have via hole conductors 115 formed in the direction of thickness thereof.

Connected to the wiring circuit layer 113a formed on the top surface of the dielectric substrate 111 is, for example, a semiconductor device 102 by means of solder bumps 104.

The via hole conductors 115 electrically connect the wiring circuit layers 113a, 113b formed on the surface of the dielectric substrate 111 with conductive layers 117, 119 formed inside of the dielectric substrate 111, and electrically connects the wiring circuit layers 113a, 113b formed on both surfaces of the dielectric substrate 111 with each other.

The insulation layer 107 has two cavities 121 formed therein, in which two capacitors 123, 123 as electric elements are respectively incorporated with such a space from each other that prevents short circuiting. The capacitors 123 are bonded with a resin adhesive 124 onto the insulation layer 105, 109 on top and bottom of the cavity 121.

The capacitor 123 embedded in the dielectric substrate 111 includes a capacitor body 128 made by laminating a plurality of inner electrode layers 125a (7a), 125b (7b) and a plurality of dielectric layers 126 (5) alternately, four first terminal electrodes 127a (6a) and four second terminal electrodes 127b (6b) provided on the periphery of the capacitor body 128, as shown in FIGS. 2A to 2C. The internal electrode layer 125a is electrically connected to the first terminal electrode 127a and the internal electrode layer 125b is electrically connected to the second terminal electrode 127b. The first and second terminal electrodes 127a, 127b are disposed along the periphery of the capacitor body 128 alternately at predetermined intervals.

Figure 6A:
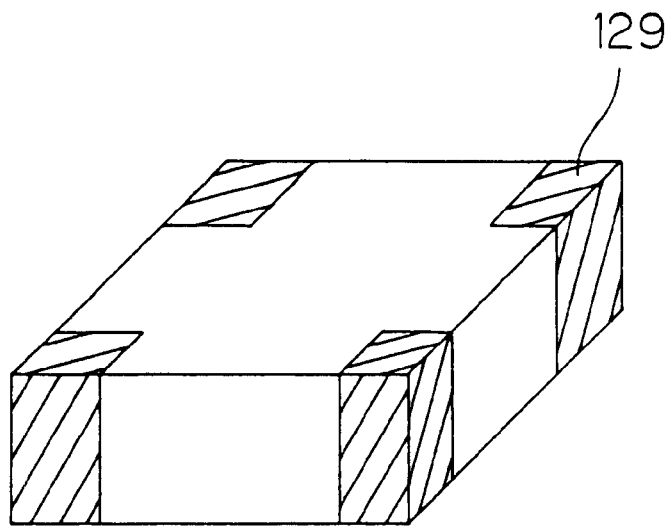
FIG. 6A is a perspective view showing an example of capacitor that can be incorporated in the wiring board of FIG. 5.
Figure 6B:
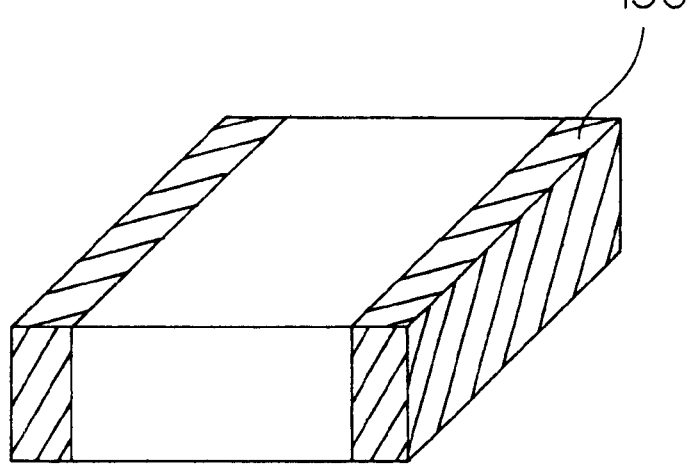
FIG. 6B is a perspective view showing further another example of capacitor.

The structure having the terminal electrodes 127a, 127b being formed from the end face of the capacitor 123 to the principal plane as described above makes it possible to use an electric element having four terminal electrodes 129 as shown in FIG. 6A or an electric element having two terminal electrodes 130 as shown in FIG. 6B.

Formed in the dielectric substrate 111 disposed between the capacitor 123 and the semiconductor device mounting surface are the first conductive layer 117 and the second conductive layer 119 spaced by a predetermined distance in the direction of thickness, namely sandwiching the insulation layer 103, as shown in FIG. 5.

Figure 7A:
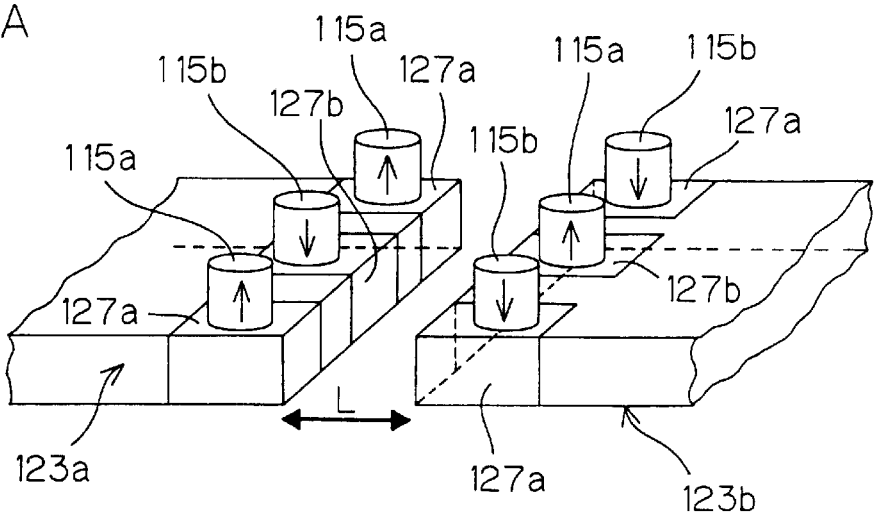
FIG. 7A is a perspective view showing external terminals of the pair of capacitors incorporated in the wiring board of FIG. 5 and the via hole conductors connected thereto.

The terminal electrodes 127a, 127b, 127a are formed in this order from near side in FIG. 7A on the edge of the capacitor 123a that opposes the capacitor 123b as shown in FIG. 8A. The terminal electrode 127a of the electric element 123a is connected to the first conductive layer 117 through the via hole conductor 115a, and the terminal electrode 127b is connected to the second conductive layer 119 through the via hole conductor 115b.

The terminal electrodes 127a, 127b, 127a are formed in this order from near side on the edge of the capacitor 123b that is disposed adjacent to the capacitor 123a similarly to the case of the capacitor 123a. The terminal electrode 127a is connected to the second conductive layer 119 through the via hole conductor 115b, and the terminal electrode 127b is connected to the first conductive layer 117 through the via hole conductor 115a.

Figure 7B:
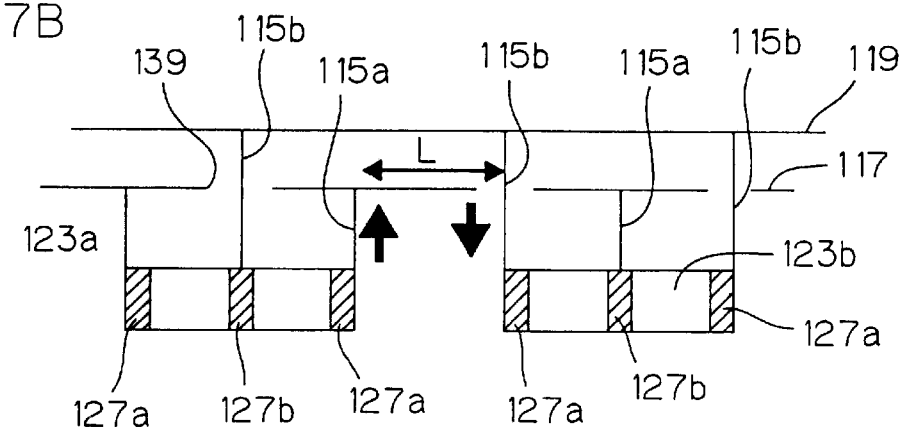
FIG. 7B shows the state of the via hole conductors being connected to the pair of adjacent capacitors.

As shown in FIG. 7B, the pair of via hole conductors 115a, 115b that are most proximate among the via hole conductors connected to terminal electrodes of the capacitors are connected to different conductive layers. As a consequence, current flows in the opposite directions through most proximate via hole conductors.

Figure 7C:
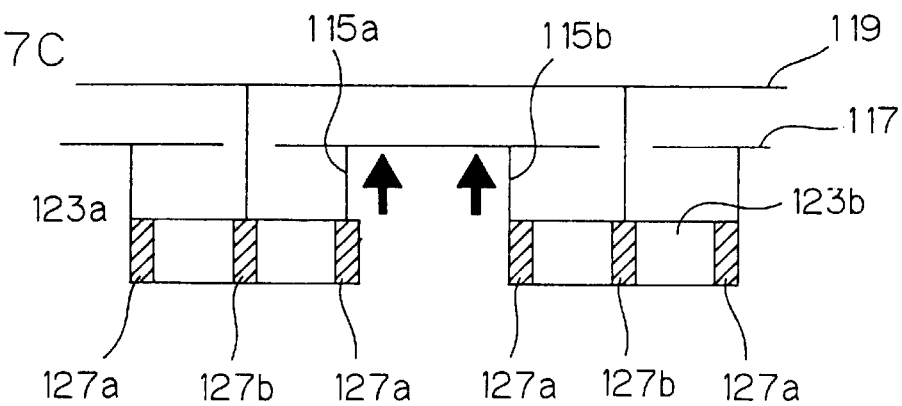
FIG. 7C shows the state of connection wherein currents flow through the via hole conductors in the same direction.

On the other hand, as shown in FIG. 7C, when the most proximate via hole conductors 115a, 115b connected to the terminal electrodes of the capacitor are connected to the same first conductive layer 117, the current flows in the same direction.

Distance L between the most proximate via hole conductors 115a, 115b is set to 0.5 mm or less. The first conductive layer 117 has an opening 139 to avoid contact with the via hole conductor 115b connected to the second conductive layer 119.

Material for Insulation Layer

There is no limitation on the material to make the dielectric substrate 111 of the wiring board B, and either sintered ceramic insulation material or an organic insulation material that includes at least an organic resin may be used as long as the electric element incorporating wiring board described above can be formed from that material. In order to form such a structure as the capacitor 123 having a plurality of electrodes that have been formed in advance is embedded in the substrate, an insulation material including an organic resin that does not need sintering process, particularly an insulation material comprising an inorganic filler and an organic resin is preferable.

The dielectric substrate 111 of the wiring board B may also comprise insulation layers 101, 103, 105, 107, 109 made of a composite material of a thermosetting resin and an inorganic filler. For the inorganic filler, at least one kind selected from $SiO_2$, $Al_2O_3$, and $BaTiO_3$ may be preferably used.

When $SiO_2$ is used for the inorganic filler, relative dielectric constant of the insulation layer can be made lower. When $Al_2O_3$ is used, thermal conductivity of the wiring board can be increased. When $BaTiO_3$ is used for the inorganic filler, relative dielectric constant of the insulation layer can be increased. In order to achieve more compact electronic apparatus having high performance capable of high-speed transmission, it is desirable to use $SiO_2$ having low dielectric constant.

For the thermosetting resin included in the insulation layer, at least one kind selected from polyphenylene ether (APPE) resin, epoxy resin and cyanate resin is preferably used. The APPE resin is particularly preferred for the low relative dielectric constant, low dielectirc loss, low water absorption and high heat resistance due to a high glass transition point thereof. The mixture may also include a dispersant and/or coupling agent in order to improve the wettability with the filler.

Production Process

An insulation sheet in uncured state made of a mixture consisting of thermosetting resin such as polyphenylene ether resin or epoxy resin and an inorganic filler such as $SiO_2$ or $Al_2O_3$ having no particular form is made to form the insulation layer.

Then via holes 153 are formed in the insulation sheets 145, 147, 149, 151 that are to become the insulation layers 101, 103, 105, 107, 109 by using carbon dioxide gas laser or a puncher, as shown in FIGS. 8A, 8B, 8C, 8E. This is followed by the formation of cavity 157 to house the capacitor 123 and via holes 159 in the insulation sheet 155 that is to be the insulation layer 107, as shown in FIG. 8D.

The via holes 153, 159 formed in the insulation sheets 145, 147, 149, 151, 155 are filled with a conductive paste that includes Cu powder, thereby to form via hole conductors 161 as shown in FIG. 8F.

Then conductive layers 163 are formed on the surfaces of the insulation sheets 145, 147, 149, 151. The conductive layers 163 may be formed in such a process as a metal foils such as copper foil or Al foil are applied onto the surfaces of the insulation sheets 145, 147, 149,151, and a conductive layer of predetermined pattern is formed by applying a resist, exposure to light, development, etching and removal of the resist. Alternatively, the conductive layer may also be formed by transferring onto the surface of the insulation sheet made of a resin film. Among these, the latter method is preferable because the insulation sheet is not exposed to an etching solution and therefore does not deteriorate.

The capacitors 123 are placed in the cavity 157 of the insulation sheet 155 and the resin adhesive 124 that includes spherical inorganic filler is applied to both surfaces of the electric element 123. Then the insulation sheets 145, 147, 149, 151 are laminated on top and bottom of the insulation sheet 155. This laminate is subjected to preheat at a temperature lower than the hardening temperature of the thermosetting resin included in the insulation sheet. Thus the resin adhesive 124 applied to the capacitor 123 hardens so that the capacitor 123 is bonded firmly onto the insulation layer, thereby preventing the wiring board from deforming in the subsequent curing process. The wiring board is then heated to a temperature at which the thermosetting resin hardens.

The high-density wiring board can be produced by forming the via hole conductors and wiring layers on the uncured insulation sheets made of the mixture of the inorganic filler and the thermosetting resin, and then laminating the sheets.

In the electric element incorporating wiring board having the constitution described above, a capacitor that functions as a component of power compensation circuit of semiconductor devices that operate at increasingly higher frequencies and lower voltages, for example, can be used as the capacitor 123. Ceramic capacitors that are compact and have high capacitance and low inductance are preferably used.

Also a plurality of capacitors may be incorporated in the electric element incorporating wiring board. For example, when n capacitors are connected in parallel, the value of capacitance increases n times while the self-inductance decreases 1/n times. This makes it possible to form a decoupling capacitor having a low inductance inside of the wiring board.

When capacitors of different capacitances are incorporated, the capacitors can be made function as a single unit. Accordingly, by taking advantage of the different resonant frequencies of the capacitors of different values of capacitance, the range of resonant frequencies, namely the low-impedance frequency band, can be widened. Thus the inductance of the electric element incorporating wiring board can be decreased effectively.

In the capacitors 123a, 123b that adjoin each other, if currents flew in the same direction through the most proximate pair of via hole conductors 115a, 115b, magnetic field generated by the current would increase as the distance L between the via hole conductor 115a becomes smaller. The magnetic field can be canceled out and inductance due to the via hole conductors can be decreased by causing the currents to flow in the opposite directions. Therefore, the constitution of this embodiment is effective in decreasing the size and increasing the density of the devices with distance between the most proximate pair of via hole conductors being set to 0.5 mm or less.

In case the most proximate pair of via hole conductors 115a, 115b connected to the external electrodes of the electric elements are connected to the same first conductive layer 117 as shown in FIG. 7C, currents flow in the same direction. As a result, magnetic field of higher intensity is generated between the via hole conductors leading to higher mutual inductance. According to this embodiment, on the contrary, since the most proximate pair of via hole conductors 115a are connected to different conductive layers, currents flow in opposite directions and therefore inductance can be decreased.

In order to decrease the inductance of the electric element incorporating wiring board further, it is effective to decrease the thickness of the insulation layer between the capacitor 123 and the semiconductor device mounting surface. Specifically, the space between the substrate surface and the capacitor is preferably set to 0.3 mm or less.

Thickness of these insulation layers is set in a range from 50 to 150 μm per layer, and may also be adjusted freely when matching the impedance for the electrical design of the electric element incorporating wiring board. The insulation layers wherein the capacitors 123 are embedded may be formed by laminating a proper number of layers in accordance to the size of the capacitor to be incorporated.

While an example of incorporating capacitors as the electric elements in the dielectric substrate ill has been described above, inductor, LC component or the like other than a capacitor may also be incorporated as the electric elements. This applies also to other embodiments described above or hereinafter.

Embodiment 5

FIGS. 9A to 9E are drawings for the explanation of processes of producing the electric element incorporating wiring board according to the fifth embodiment of the present invention.

First, as shown in FIG. 9A, a soft insulation sheet 201 including a thermosetting resin (B stage) is prepared. Via holes are formed to penetrate through the insulation sheet 201 in the direction of thickness thereof. Among the via holes, those connected to the electrodes of a capacitor as an example of electric element are filled with a conductive paste by screen printing or suction process, thereby forming via hole conductors 202 for the connection with the capacitor.

The insulation sheet 201 can be made by well mixing a thermosetting resin or mixture of thermosetting resin and a filler in a kneading machine or a 3-roll mixer and forming the resin or mixture into a sheet by rolling, extrusion, injection or doctor blade process. The sheet may be semi-cured by heat treatment at a temperature a little lower than the curing temperature, as required.

The via holes and cavities can be formed in the insulation sheet by a known method such as drilling, punching, sand blast or laser machining using carbon dioxide laser, YAG laser or excimer laser.

The thermosetting resin used to form the insulation sheet may be epoxy resin, phenol resin, unsaturated polyester resin, polyimide resin, polyamideimide resin, thermosetting polyphenylene ether resin or the like. Among these, thermosetting polyphenylene ether resin is most preferably used for the electric characteristic as an insulation material, heat resistance and mechanical strength thereof.

The insulation sheet 201 may also be made of a composite material consisting of an organic resin and a filler to increase the strength of the dielectric substrate or the wiring board as a hole. For the filler used in combination with the organic resin, inorganic fillers such as $SiO_2$, $Al_2O_3$, $ZrO_2$, $TiO_2$, AlN, SiC, $BaTiO_3$, $SrTiO_3$, zeolite, $CaTiO_3$, and aluminum borate are preferably used. Nonwoven fabric or woven fabric made of glass or aramid resin may also be impregnated with the resin. Proper proportions of mixing the organic resin and the filler are in a range from 30:70 to 65:35 by volume.

Among the materials described above, prepreg made by impregnating woven or nonwoven fabric of glass with a resin is most preferably used for the ease of machining by punching or laser.

The conductive paste is made to include a metal having a low melting point such as Cu or Ag. The metal powder has mean particle size preferably in a range from 0.5 to 5 μm. When the mean particle size of the metal powder is less than 0.5 μm, contact resistance between the metal powder particles increases, leading to higher resistance of the via hole conductors. When the mean particle size is larger than 5 μm, it becomes difficult to decrease the resistance of the via hole conductors.

The conductive paste is made by mixing the metal powder with an organic resin binder and a solvent. The solvent added to the paste is required only to be capable of dissolving the organic binder resin and may be, for example, isopropyl alcohol, terpineol, 2-octanol, butylcarbitol acetate or the like.

For the organic binder resin included in the conductive paste, cellulose may be used in addition to the organic resin that is used to make the various insulation layers described previously. The organic resin binds the metal powder with the particles thereof in contact with each other and, at the same time, bonds the metal powder with the insulation sheet.

The organic resin is preferably included in the metal paste in a proportion in a range from 0.1 to 40% by volume, and more preferably in a range from 0.3 to 30% by volume. When the resin content is less than 0.1% by volume, it becomes difficult to bind the metal particles firmly together and to bond the low-resistance metal firmly to the insulation layer. When the resin content is more than 40% by volume, the metal particles are separated by the resin existing therebetween and it becomes difficult to bring the metal particles into contact with each other, resulting in higher resistance of the via hole conductor.

It is also desirable that the conductive paste includes 5 to 60% by weight of solder such as Pb—Sn in order to improve the bonding characteristic of the paste with the electrodes of the capacitor.

Then as shown in FIG. 9B, a wiring circuit layer 203 is formed on the front or back surface of the insulation sheet 201. The wiring circuit layer 203 is formed in such a process as 1) after adhering a metal foil on the surface of the insulation sheet 201, the metal foil is etched to form the circuit pattern; 2) a resist is applied to the surface of the insulation sheet 201 and the circuit pattern is formed by plating; or 3) after adhering a metal foil on the surface of a transfer film and etching the metal foil to form the circuit pattern, the circuit pattern comprising the metal foil is transferred onto the surface of the insulation sheet 201. At this time, either the wiring circuit may not be formed or connection pads that include the metal of low melting temperature may be provided for the via hole conductors 202 that are connected to the terminal electrodes of the capacitor.

The wiring circuit layer 203 is preferably made of one or more kinds of metal or alloy selected from copper, aluminum, gold and silver. Copper or an alloy including copper is most desirable. Also, as the case maybe, a high-resistance metal such as Ni—Cr alloy may be mixed as a component of the conductor or alloyed thereby to adjust the resistance of the circuit. Moreover, in order to decrease the resistance of the wiring layer, 2 to 20% by weight of a metal having melting point lower than that of the low-resistance metal, for example, a low-melting point metal such as solder or tin may be included in the metal component of the conductor.

The capacitor embedded in the wiring board has at least a pair of terminal electrodes on the surface thereof and maybe, for example, an ordinary laminated ceramic capacitor (refer to FIG. 6B) having a pair of terminal electrodes formed on the ends thereof or a laminated capacitor (refer to FIGS. 2A, 6A) having a plurality of positive terminal electrodes and a plurality of negative terminal electrodes.

According to this embodiment, surface of the capacitor 204 other than the terminal electrodes is covered by a thermoplastic resin 205 as shown in FIG. 9C. The thermoplastic resin 205 may be applied to the surface of the capacitor 204, for example, by dipping the capacitor in a solution made by dissolving the thermoplastic resin 205 in a solvent and lifting it up. Or, alternatively, after applying the solution onto the surface of the capacitor other than the terminal electrodes, the solvent may be removed by heating and drying, thereby to form the resin film on the surface of the capacitor 204.

It is important that the thermoplastic resin 205 has a glass transition point not higher than 100° C. and particularly 70° C. or lower. When the glass transition point is higher than 100° C., rigidity of the resin becomes too high resulting in insufficient effect of relieving the stress and, in addition, the resin itself becomes prone to thermal degradation resulting in lower strength to impact and lower bonding strength.

For the thermoplastic resin, one kind or a combination of two or more kinds selected from among polyester resin, polyamide resin and polyurethane resin is used. These materials are desirable for improving the bonding performance when thermosetting polyphenylene ether resin is used for the insulation layer. It is necessary to form the coating layer made of the resin on the surface of the capacitor other than the terminal electrodes. When the resin is applied to the entire surface of the capacitor, the coating layer formed on the terminal electrode surface can be removed by irradiation of light with carbon dioxide laser, YAG laser or excimer laser.

Thickness of the coating layer formed from the resin on the capacitor surface is preferably in a range from 5 to 150 $\mu$m, and more preferably in a range from 30 to 80 $\mu$m to perform the function of absorbing stress.

The capacitor 204 of this embodiment comprises a laminated capacitor body 204a, made by laminating dielectric layers and internal electrodes (not shown) alternately, having four positive terminal electrodes 206a and four negative terminal electrodes 206b formed on the corners and the sides, as shown in FIGS. 2A to 2C.

After forming a cavity 210 for housing the capacitor 204 in the insulation sheet 207 among the plurality of insulation sheets as shown in FIG. 9D, the capacitor 204 is placed in the cavity 210. Then the sheet is laminated with other insulation sheets 201, 208, 209. The terminal electrodes 206 of the capacitor 204 are aligned to make contact with the end faces of the via hole conductors 202 in the insulation sheets 201, 209.

The laminate made as described above is heated to a temperature not lower than the curing temperature of the thermosetting resin 205 included in the insulation sheet 201, thereby completely hardening the insulation sheets 201, 207, 208, 209.

Thus a multi-layer wiring board having the capacitor mounted thereon while being electrically connected to the via hole conductors 202 in the cavity 210, with the capacitor 204 being housed in the closed space of the cavity 210 inside of the multi-layer wiring board C, as shown in FIG. 9E.

In the capacitor incorporating wiring board made by the method described above, surface of the capacitor 204 is covered by a layer made of the thermoplastic resin having glass transition point not higher than 100° C. When subjected to thermal cycles with the temperature changing between the room temperature and 125° C., for example, a stress is generated due to the difference in thermal expansion coefficient between the capacitor 204 and the insulation layer 201. In this case, plastic deformation of the thermoplastic resin 205 absorbs and mitigates the stress, thereby preventing the capacitor 204 from being damaged by the stress and the connection with the via hole conductors 202 from being impaired.

Moreover, the thermoplastic resin 205 exists between the capacitor 204 and the insulation layers surrounding the capacitor on top, bottom and all sides thereof thereby effecting firm bond therebetween. As a result, the capacitor 204 can be embedded in the wiring board in a stable condition.

The method described above can be extended to produce a wiring board incorporating capacitors of any possible form. For example, a plurality of capacitors covered with a resin can be mounted in a plurality of cavities formed either in the same layer or in different layers in the multi-layer wiring board.

Since a plurality of capacitors can be easily embedded in the wiring board, such a capacitor incorporating wiring board can be provided as the wiring board can be made smaller and the density of mounting the capacitors can be increased. Moreover, since connecting the capacitors to the wiring board and the production of the multi-layer wiring board can be carried out at the same time, the production process can be simplified and the production yield can be improved, thereby decreasing the production cost.

EXAMPLE 1

(Corresponding to the First Embodiment)

(1) Patterns of internal electrodes for positive electrode and internal electrodes for negative electrode as shown in FIGS. 2B and 2C were formed by screen printing using Ag—Pd metal paste on the surfaces of a plurality of ceramic dielectric sheets made of a material based on $BaTiO_3$. The sheets were then placed one on another at a temperature of 55° C. under a pressure of 150 kg/cm² to form a laminate. The laminate in the state of green sheet was cut using a cutter. Then the laminate was fired in atmosphere at a temperature of 1220° C. to make the base body of the capacitor.

The base body of the capacitor was coated with the Ag—Pd paste on the external surfaces in the positive terminal electrode forming portion and the negative terminal electrode forming portion thereof and was fired at a temperature of 850° C., thereby making an 8-terminal laminated ceramic capacitor having a plurality of positive terminal electrodes and negative terminal electrodes as shown in FIG. 2A.

The capacitor has dimensions of 1.6×1.6×0.3 mm, capacitance of 11.0 nF and self-inductance of 80 pH, with four positive terminal electrodes and four negative terminal electrodes formed thereon.

(2) A prepreg was made from 55% by volume of A-PPE (thermosetting polyphenylene ether) resin (curing temperature 20° C.) and 45% by volume of glass fiber. A cavity measuring 1.7×1.7 mm, slightly larger than the capacitor to be housed therein, was formed at a part of the prepreg by trepanning using carbon dioxide laser.

(3) A plurality of insulation sheets each measuring 150 μm in thickness were made by applying doctor blade process to a mixture of PPE (polyphenylene ether) resin in the state of varnish and 50% by volume of silica powder. A plurality of via holes 0.1 mm in diameter were formed by punching in the insulation sheets for the formation of via hole conductors to connect the conductive layer and the bumps of the semiconductor device and via hole conductors to connect the capacitors and the conductive layer. The via holes were filled with a conductive paste including copper powder having mean particle size of 5 μm with the particles plated with silver on the surface thereof, to form the via hole conductors. Thus 42 to 252 via hole conductors were formed according to the number of the bumps of the semiconductor devices.

(4) An adhesive was applied to the surface of a transfer sheet made of polyethylene terephthalate (PET), and the surface was entirely covered with a copper foil having thickness of 12 μm and surface roughness of 0.8 μm. With a photoresist (dry film) being applied to the surface, the sheet was exposed to light, dipped in ferric chloride solution to remove unnecessary portions by etching, thereby forming a conductive layer for positive electrode and a conductive layer for negative electrode. The circuit pattern thus made is made up of fine lines 20 μm in width and 20 μm apart from each other.

(5) After pressing the conductive layer side of the transfer sheet into contact with the insulation sheet made in the step (2) with a pressure of 30 kg/cm², the transfer sheet was removed while leaving the conductive layer on the insulation sheet.

(6) A laminated ceramic capacitor chip made in the step (1) was temporarily placed in the cavity of the prepreg made in the step (2), and filled the space around chip with a mixture of epoxy resin in 40% by volume and silica in 60% by volume for temporary fixing.

The two insulation sheets having the conductive layers and the via hole conductors made through the steps (3) and (4) were laminated on the surface, and further thereon, one insulation sheet having via hole conductors and the wiring layer formed thereon was temporarily laminated to make the semiconductor device mounting surface. With the capacitor made in the step (1) to be incorporated being placed on the surface opposite to the semiconductor device mounting surface, the terminal electrodes formed on the surface of the capacitor were aligned to make contact with the exposed end faces of the via hole conductors, and temporarily fixed with an organic adhesive.

(7) The laminate was heated at 200° C. for one hour to harden completely, thereby making the multi-layer wiring board. Fluidization of the resin by the heating almost eliminated the gap and brought the capacitor chip and the insulation layer into close contact with each other. Thus an evaluation board having insulation layers each 0.10 mm thick was made.

The capacitor incorporating wiring board made as described above was tested to measure the frequency characteristic of impedance in a frequency range from 1.0 MHz to 1.8 MHz using an impedance analyzer, and to measure the capacitance of the capacitor at 1 MHz. Then inductance was calculated from the resonant frequency using the equation of $f_0=1/(2\pi(L \cdot C)^{1/2})$, where $f_0$ is the resonant frequency (Hz), C is the capacitance (F) and L is the inductance (H).

Change in the characteristic was measured while changing the thickness of the insulation layer formed on the top surface of the capacitor as shown in Table 1.

Comparative Example

Comparative boards 1 (No. 1-9) where one of the positive terminal electrodes and one of the negative terminal electrodes of the 8-terminal capacitor were lead directly by the via hole conductors to the substrate surface without the conductive layer intervening, and comparative boards 2 (No. 1-10) where a capacitor was placed on the surface of the wiring board side by side with the semiconductor device and connected through the internal wiring layer with the semiconductor device were made.

Comparative wiring boards 3 (No. 1-11) were made where a conventional laminated ceramic capacitor having a pair of terminal electrodes (one positive terminal electrode and one negative terminal electrode) was used for the capacitor to be incorporated, and the electrodes of the capacitor were lead directly by the via hole conductors to the substrate surface without the conductive layer intervening therebetween, with similar evaluation test being conducted.

TABLE 1

| No. | Type mount | Thickness of insulation layer μm | Intervals of via holes mm | No. of via holes | Capacitance nF | Resonant frequency MHz | Inductance pH | Remarks |
|---|---|---|---|---|---|---|---|---|
| 1-1 | Embedded | 300 | 0.6 | 42 | 11.05 | 136 | 124.06 | 8-terminal capacitor |
| 1-2 | Embedded | 300 | 0.3 | 84 | 11.04 | 140 | 117.18 | 8-terminal capacitor |
| 1-3 | Embedded | 300 | 0.2 | 126 | 11.04 | 150 | 102.08 | 8-terminal capacitor |
| 1-4 | Embedded | 300 | 0.1 | 252 | 11.03 | 165 | 84.44 | 8-terminal capacitor |
| 1-5 | Embedded | 150 | 0.6 | 42 | 11.03 | 160 | 89.80 | 8-terminal capacitor |
| 1-6 | Embedded | 200 | 0.6 | 42 | 11.02 | 144 | 110.96 | 8-terminal capacitor |
| 1-7 | Embedded | 400 | 0.6 | 42 | 11.02 | 118 | 165.25 | 8-terminal capacitor |
| 1-8 | Embedded | 500 | 0.6 | 42 | 11.03 | 92 | 271.60 | 8-terminal capacitor |
| *1-9 | Embedded | 300 | 0.6 | 42 | 11.03 | 80 | 359.19 | 2-terminal connection with via holes |
| *1-10 | Surface mount | 300 | 0.6 | 42 | 11.03 | 85 | 318.18 | 8-terminal capacitor |
| *1-11 | Embedded | 300 | 0.6 | 42 | 11.03 | 57 | 707.55 | 2-terminal capacitor |

*Comparative Example

As will be apparent from Table 1, the capacitor incorporating wiring board (sample Nos. 1-1 to 1-8) of the present invention where the capacitor having a plurality of terminal electrodes being embedded therein and the conductive layer for positive electrode and the conductive layer for negative electrode being formed thereon exhibit higher resonant frequency and inductance of 300 pH or less, compared to the wiring boards (sample No. 1-11) where the capacitor is incorporated therein but the conductive layer for positive electrode and the conductive layer for negative electrode are not formed. In the wiring board of the present invention, the inductance can be decreased as the thickness of the insulation layer is decreased.

In the wiring boards (sample No. 1-10) where the capacitor is mounted on the surface thereof, measuring terminals are passed from the sample through the inner layers. As a result, the inductance is higher than that of the embedding type even when the semiconductor device and the capacitor are mounted as near to each other as 0.3 mm.

EXAMPLE 2

(Corresponding to the Second Embodiment)

(1) Patterns of the internal electrode for positive electrode and the internal electrode for negative electrode as shown in FIGS. 2B and 2C were formed by screen printing using Ag—Pd metal paste on the surfaces of a plurality of ceramic dielectric sheets made of a material based on $BaTiO_3$. The sheets were placed one on another at a temperature of 55° C. under a pressure of 150 kg/cm$^2$ to form a laminate. The laminate in the state of green sheet was cut using a cutter. Then the laminate was fired in atmosphere at a temperature of 1220° C. to make the base body of the capacitor. The base body of the capacitor was coated with the Ag—Pd paste on the external surfaces in the positive terminal electrode forming portion and negative terminal electrode forming portion thereof and was fired at a temperature of 850° C., thereby making an 8-terminal laminated ceramic capacitor having a plurality of positive terminal electrodes and negative terminal electrodes as shown in FIG. 2A.

The capacitor has thermal expansion coefficient of $10.2 \times 10^{-6}$/° C. at temperatures from −65 to 250° C., dimensions of 1.6×1.6×0.59 mm, capacitance of 0.22 μF and self-inductance of 80 pH, with four positive terminal electrodes and four negative terminal electrodes formed thereon.

(2) PPE (polyphenylene ether) resin in the state of varnish and 50% by volume of silica powder were mixed. A plurality of insulation sheets A each measuring 150 μm in thickness were made by applying doctor blade process to the mixture. A cavity measuring 1.6×1.6 mm, slightly larger than the capacitor to be housed therein was formed in the insulation sheets A by trepanning using carbon dioxide laser.

Via holes were made also by means of carbon dioxide laser, and were filled with a conductive paste including conductive powder such as Cu powder thereby forming via hole conductors. For the formation of the via hole conductors to connect the conductive layer and the bumps of the semiconductor device and formation of the via hole conductors to connect the capacitors and the conductive layer, 252 via holes were formed in accordance to the number of the bumps of the semiconductor device. 252 via hole conductors were formed by filing the via holes with including copper powder having mean particle size of 5 μm with the particles plated with silver on the surface thereof.

(3) An insulation sheet B made of prepreg was made from 52 to 68% by volume of A-PPE (thermosetting polyphenylene ether) resin (curing temperature 22° C.) and 32 to 48% by volume of glass fabric. Via holes 23 were formed in part of the prepreg by trepanning with carbon dioxide laser, and were filled with a conductive paste including conductive powder such as Cu powder thereby forming via hole conductors 24.

(4) An adhesive was applied to the surface of a transfer sheet made of polyethylene terephthalate (PET) resin, and the surface was entirely covered with a copper foil having thickness of 12 μm and surface roughness of 0.8 μm. With a photoresist (dry film) being applied to the surface, the sheet was exposed to light, dipped in ferric chloride solution to remove unnecessary portions by etching, thereby forming the conductive layer for positive electrode and the conductive layer for negative electrode. A fine circuit pattern was also formed consisting of lines 20 μm in width and 20 μm apart from each other.

(5) After pressing the conductive layer side of the transfer sheet into contact with the insulation sheet B made in the step (3) with a pressure of 30 kg/cm², the transfer sheet was removed while leaving the conductive layer on the insulation sheet B.

(6) The insulation sheets A having the cavity formed therein made in the step (2) were laminated to match the thickness of the capacitor, and the laminated ceramic capacitor chip made in the step (1) was temporarily placed in the cavity. The space around chip was filled with a mixture of epoxy resin in 40% by volume and silica in 60% by volume for temporary fixing.

(7) The insulation sheets B having the conductive layers and the via hole conductors made through the steps (3) and (4) were temporarily laminated on the front surface and the back surface of the insulation sheet A that houses the capacitor therein.

(8) The laminate was heated at 220° C. for one hour to harden completely, thereby making the multi-layer wiring board. Fluidization of the resin by the heating almost eliminated the gap and brought the capacitor chip and the insulation layer into close contact with each other. Thus the capacitor incorporating wiring board having total thickness of 1.2 mm was made.

The capacitor incorporating wiring board made as described above was tested as follows.

Thermal expansion coefficient of the board as a whole at temperatures from −65 to 250° C. was measured. An Si chip having Au stud bumps was mounted by flip chip mounting on the board heated to about 60° C. Resistance between the pads on the board and the circuit on the Si chip side was measured to check the continuity. The mechanical strength of the wiring board was measured using an Instron instrument.

Frequency characteristic of impedance was measured in a frequency range from 1.0 MHz to 1.8 MHz using an impedance analyzer. At the same time, capacitance of the capacitor at 1 MHz was measured. Then inductance was calculated from the resonant frequency using the equation of $f_0=1/(2\pi(L \cdot C)^{1/2})$, where $f_0$ is the resonant frequency (Hz), C is the capacitance (F) and L is the inductance (H).

Impedance was also measured at room temperature as well as after 100 cycles of thermal shock. Change in the characteristic was measured while changing the thickness of the insulation layer formed on the top surface of the capacitor as shown in Tables 2-1 and 2-2. In the thermal shock test, a temperature cycle of five minutes between −55 and 125° C. was repeated 100 times in a chamber kept at a pressure of 1 atm using carbon dioxide gas as the refrigerant and an electric heater as the heat source.

Comparative Example 2-1

Evaluation tests similar to those described above were conducted on a wiring board made by using only insulation sheets made of the mixture of the thermosetting resin and the inorganic filler of (3) of the example described above.

Comparative Example 2-2

Evaluation tests similar to those described above were conducted on a wiring board made similarly to the example described above except that arrangement of the insulation sheet A and the insulation sheet B was inverted and the capacitor was embedded in the insulation sheet B.

TABLE 2-1

| | First insulation layer (CPC) | | | Second insulation layer (prepreg) | | | Capacitor-embedding layer | Difference |
|---|---|---|---|---|---|---|---|---|
| | Inorganic filler | | Thickness | Thermal expansion | Glass fiber | Thickness | Thermal expansion | | in thermal expansion |
| Sample No. | Type | Volume % | mm | coefficient × $10^{-6}/°$ C. | Volume % | mm | coefficient × $10^{-6}/°$ C. | Type | coefficient × $10^{-6}/°$ C. |
| *2-1 | SiO₂ | 30 | 0.1 | 27.6 | 32 | 0.1 | 20.8 | First insulation layer | 17.4 |
| *2-2 | SiO₂ | 35 | 0.1 | 22.8 | 48 | 0.1 | 17.8 | First insulation layer | 12.6 |
| 2-3 | SiO₂ | 45 | 0.1 | 17 | 48 | 0.1 | 17.8 | First insulation layer | 6.8 |
| 2-4 | SiO₂ | 50 | 0.1 | 15.5 | 48 | 0.1 | 17.8 | First insulation layer | 5.3 |
| 2-5 | SiO₂ | 65 | 0.1 | 11.3 | 48 | 0.1 | 17.8 | First insulation layer | 1.1 |
| 2-6 | SiO₂ | 70 | 0.1 | 9.2 | 48 | 0.1 | 17.8 | First insulation layer | 1 |
| 2-7 | Al₂O₃ | 50 | 0.1 | 16.8 | 32 | 0.1 | 15.7 | First insulation layer | 6.6 |
| 2-8 | AlN | 50 | 0.1 | 15.7 | 32 | 0.1 | 15.7 | First insulation layer | 5.5 |
| *2-9 | SiO₂ | 50 | 0.1 | 15.5 | — | — | — | First insulation layer | 5.3 |
| *2-10 | SiO₂ | 50 | 0.1 | 15.5 | 48 | 0.1 | 17.8 | Second insulation layer | 7.6 |

*Comparative Example

TABLE 2-2

| Sample No. | Substrate strength MPa | Overall thermal expansion coefficient of substrate × $10^{-6}/°$ C. | Continuity after flip chip mounting | Inductance Room temperature pH | Inductance After test pH | Remarks |
|---|---|---|---|---|---|---|
| *2-1 | 320 | 23.2 | No | 121 | 488 | |
| *2-2 | 337 | 19.3 | Yes | 118 | 123 | |
| 2-3 | 356 | 17.4 | Yes | 116 | 120 | |
| 2-4 | 372 | 16.5 | Yes | 117 | 118 | |
| 2-5 | 381 | 14.5 | Yes | 118 | 118 | |
| 2-6 | 366 | 13.8 | Yes | 117 | 119 | |
| 2-7 | 368 | 17.3 | Yes | 116 | 122 | |
| 2-8 | 352 | 17.2 | Yes | 119 | 125 | |
| *2-9 | 250 | 15.5 | No | 121 | 502 | First insulation layer only |
| *2-10 | 340 | 16.5 | Yes | 117 | 220 | |

*Comparative Example

As will be apparent from Tables 2-1 and 2-2, the wiring board of the present invention made by forming the insulation layer comprising the prepreg located at the surface layer of the wiring board and the insulation layer (CPC) consisting of a mixture of the inorganic filler and the thermosetting resin as the internal layer that accommodates the capacitor has a mechanical strength as high as 300 MPa, and allows flip chip mounting. As to the change in the inductance due to the capacitor, high reliability was shown with no change from the initial characteristic at the room temperature after the thermal shock test.

EXAMPLE 3

(Corresponding to the Third Embodiment)

(1) Patterns of the internal electrode for positive electrode and the internal electrode for negative electrode as shown in FIGS. 2A to 2C were formed by screen printing using Ag—Pd metal paste on the surfaces of a plurality of ceramic dielectric sheets made of a material based on $BaTiO_3$. The sheets were placed one on another at a temperature of 55° C. under a pressure of 150 kg/cm² to form a laminate. The laminate in the state of green sheet was cut using a cutter. Then the laminate was fired in atmosphere at a temperature of 1220° C. to make the base body of the capacitor.

The base body of the capacitor was coated with a conductive paste, made of Cu powder with glass frit including $SiO_2$ added, on the external surfaces in the positive terminal electrode forming portion and the negative terminal electrode forming portion thereof and was fired at a temperature of 850° C., thereby to form a Cu conductive layer of 11 μm thick. Then a Ni plating film 3.0 μm thick and a Sn plating film 2.0 μm thick were formed by using an electric barrel plating apparatus equipped with a chamber having a capacity of 5 liters containing steel balls of diameter 0.3 mm, thereby making an 8-terminal laminated ceramic capacitor having four positive terminal electrodes and four negative terminal electrodes as shown in FIG. 2A. The capacitor has dimensions of 1.6×1.6×0.3 mm, capacitance of 11.0 nF and self-inductance of 80 pH.

(2) A prepreg was made from 55% by volume of A-PPE (thermosetting polyphenylene ether) resin (curing temperature 20° C.) and 45% by volume of glass fabric. A cavity measuring 1.7×1.7 mm, slightly larger than the capacitor to be housed therein, was formed in a part of the prepreg by trepanning using carbon dioxide laser.

(3) PPE (polyphenylene ether) resin in the state of varnish and 50% by volume of silica powder were mixed. A plurality of insulation sheets each measuring 150 μm in thickness were made by applying doctor blade process to the mixture. For the formation of the via hole conductors to connect the conductive layer and the bumps of the semiconductor device and to connect the capacitors and the conductive layer, a plurality of via holes 0.2 mm in diameter were made by punching. A mixture of copper powder having mean particle size of 5 μm with the particles thereof being plated with silver on the surface thereof and Sn alloy (Sn—Ag—Cu—Bi) powder in proportions shown in Table 3 was prepared. 100 weight part of this mixture was mixed with 12 weight part of triallyl isocyanurate and oligomer thereof as the resin component to make a conductive paste, and filled the via holes with the paste to form via hole conductors.

(4) An adhesive was applied to the surface of a transfer sheet made of polyethylene terephthalate (PET) resin, and the surface was entirely covered with a copper foil having thickness of 12 μm and surface roughness of 0.8 μm. With a photoresist (dry film) being applied to the surface, the sheet was exposed to light, dipped in ferric chloride solution to remove unnecessary portions by etching, thereby forming the conductive layer for positive electrode and the conductive layer for negative electrode. A fine circuit pattern was made consisting of lines 20 μm in width and 20 μm apart from each other.

(5) After pressing the conductive layer side of the transfer sheet into contact with the insulation sheet made in the step (2) with a pressure of 30 kg/cm², the transfer sheet was removed while leaving the conductive layer on the insulation sheet.

(6) The laminated ceramic capacitor chip made in the step (1) was temporarily placed in the cavity of the prepreg made in the step (2). The space around the chip was filled with a mixture of epoxy resin in 40% by volume and silica in 60% by volume for temporary fixing.

The two insulation sheets having the conductive layers and the via hole conductors formed therein made in the steps (3) and (4) were laminated and, further thereon, one insulation sheet having via hole conductors and the wiring circuit layer formed thereon was temporarily laminated to make the semiconductor device mounting surface. With the capacitor made in the step (1) to be incorporated being placed on the surface opposite to the semiconductor device mounting surface, the electrodes formed on the surface of the capacitor were aligned to make contact with the exposed end faces of the via hole conductors, and temporarily fixed with an organic adhesive.

(7) The laminate was heated at 220° C. for one hour to harden completely, thereby making the multi-layer wiring board. Fluidization of the resin due to the heating almost eliminated the gap and brought the capacitor chip and the insulation layer into close contact with each other. Thus an evaluation substrate having thickness of 0.10 mm per insulation layer was made.

The capacitor incorporating wiring board made as described above was tested to measure the frequency characteristic of impedance in a frequency range from 1.0MHz to 1.8 MHz using an impedance analyzer, and to measure the capacitance of the capacitor at 1 MHz. Then inductance was calculated from the resonant frequency using the equation of $f_0 = 1/(2\pi(L \cdot C)^{1/2})$, where $f_0$ is the resonant frequency (Hz), C is the capacitance (F) and L is the inductance (H).

The inductance was measured also after thermal shock test (−55 to 125° C.). Specifically, a temperature cycle of five minutes between −55 and 125° C. was repeated 100 times in a chamber kept at a pressure of 1 atm using carbon dioxide gas as the refrigerant and an electric heater as the heat source and, within 24 hours, the capacitance and impedance were measured at the room temperature under a voltage of 0.5V.

Formation of the Cu—Sn intermetallic compound in the junctions between the terminal electrodes of the capacitor and the via hole conductors on the wiring board was checked by means of an electron beam micro-analyzer (EPMA). Characteristic X-ray intensities of elements were determined through quantitative measurements by the EPMA, thereby calculating the ratio of $Cu_3Sn$ precipitated. Ratio Sn/(Cu+Sn) by weight in the junction was determined through quantitative analysis using Cu as the reference.

Comparative Example 3-1

Figure 10A:
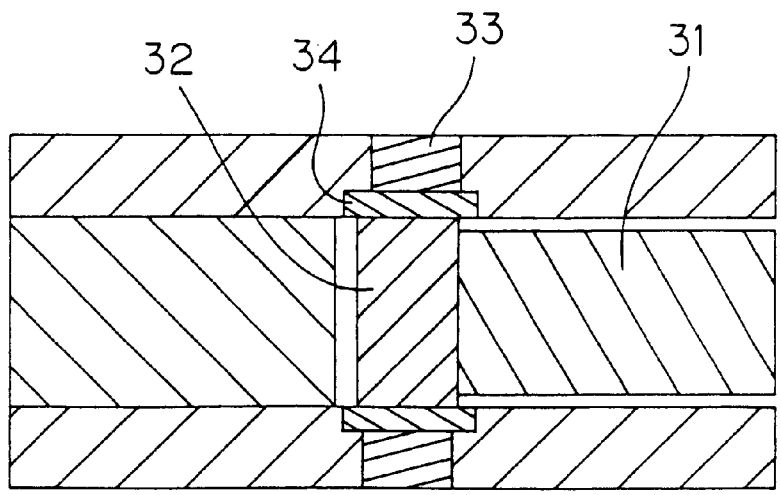
FIGS. 10A and 10B are sectional views for explaining the structure of the Comparative Example in comparison to the present invention, showing the state of terminal electrodes of a capacitor being connected to via hole conductors.

A land 34 consisting of a copper foil was formed by transfer process on the end of the via hole conductor 33 at a position where the terminal electrode 32 of the capacitor 31 was to be connected, as shown in FIG. 10A. The capacitor terminal electrode 32 was connected to the land 34 by pressure contact during the final curing of the wiring board, and evaluation tests similar to those described above were conducted.

Comparative Example 3-2

Figure 10B:
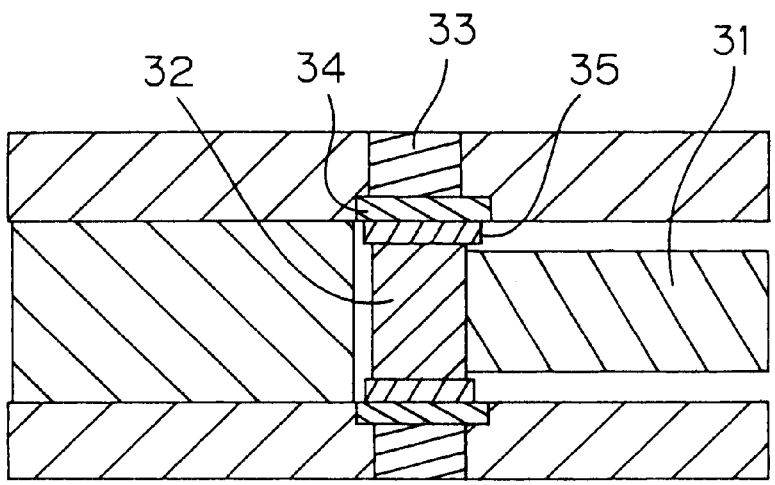

A land 34 consisting of a copper foil was formed by transfer process on the end of the via hole conductor 33 at a position where the terminal electrode 32 of the capacitor 31 was to be connected, as shown in FIG. 10B. The capacitor terminal electrode 32 was connected to the land 34 by means of Pb—Sn solder 35 at 230° C., and evaluation tests similar to those described above were conducted.

Results of the evaluation are shown in Table 3.

TABLE 3

| Sample No. | Composition of metal components in via hole conductor (weight %) | | Capacitor terminal electrode structure | Weight ratio Sn/(Cu + Sn) in via hole conductor (%) | Constituent phase of junction** | H1/H2 | Inductance (pH) | | Remarks |
|---|---|---|---|---|---|---|---|---|---|
| | Cu (Ag-coated) | Sn | | | | | Initial value | After reflow | |
| *3-1 | 79 | 30 | Cu—Ni—Sn | 46 | C | 0.2 | 122 | 305 | |
| 3-2 | 60 | 40 | Cu—Ni—Sn | 53.6 | C, C3S | 1.2 | 118 | 121 | |
| 3-3 | 50 | 50 | Cu—Ni—Sn | 62.4 | C, C3S, C6S5 | 1 | 119 | 122 | |
| 3-4 | 40 | 60 | Cu—Ni—Sn | 72.3 | C, C3S, C6S5 | 0.8 | 121 | 125 | |
| 3-5 | 30 | 70 | Cu—Ni—Sn | 82.1 | C, C3S, C6S5 | 0.75 | 128 | 128 | |
| 3-6 | 20 | 80 | Cu—Ni—Sn | 90.3 | C, C3S, C6S5 | 0.65 | 131 | 135 | |
| *3-7 | 50 | 50 | Cu—Ni | 51.2 | C | — | 148 | 250 | Capacitor without Sn layer |
| *3-8 | 50 | 50 | Cu—Ni—Sn | 61.8 | — | — | 141 | 403 | Pressure contact only |
| *3-9 | 190 | — | Cu—Ni | 0 | Pb—Sn | — | 153 | 353 | Solder connection |
| *3-10 | 100 | — | Cu—Ni | 0 | C | — | 158 | 420 | Via hole conductor Cu only |

*Comparative Example
**C represents Cu, C3S represents $Cu_3Sn$ and C6S5 represents $Cu_6Sn_5$, respectively.

As will be apparent from Table 3, it was confirmed that Cu—Sn intermetallic compound was produced by forming the Sn-containing conductive layer on the outermost layer of the terminal electrode while using the conductive paste made by mixing Cu and Sn in predetermined proportions for the via hole conductors of the wiring board. Moreover, formation of the intermetallic compound improved the heat resistance compared to a case of connecting by pressure contact of the prior art or simple connection by soldering. Also after solder reflow, good result was achieved with changes in inductance within 10%.

Generation of intermetallic compound was not observed and changes in inductance exceeded 10% in Comparative Example 3-1 (sample No. 3-8) of the conventional pressure contact, Comparative Example 3-2 (sample No. 3-9) where connection was made by soldering, the sample No. 3-10 with via hole conductors formed solely from Cu and the sample No. 3-9 having the terminal electrodes of the capacitor connected to the land by soldering.

EXAMPLE 4

(Corresponding to the Fourth Embodiment)

A ceramic capacitor was made as follows as the electric element to be incorporated. Patterns of internal electrodes as shown in FIGS. 2B, 2C were formed by screen printing using Ni metal paste on the surfaces of a plurality of ceramic dielectric sheets made of a material based on $BaTiO_3$. The sheets were placed one on another at a temperature of 55° C. under a pressure of 150 kg/cm² to form a laminate. The laminate in the state of green sheet was cut using a cutter. Then the laminate was fired in reducing atmosphere at a temperature of 1250° C. to make the base body of the capacitor.

The base body of the capacitor was coated with a Cu—Ni paste on the terminal electrode forming portion and was fired at a temperature of 850° C., thereby making the ceramic capacitor shown in FIG. 2A. The capacitor has dimensions of 1.6×1.6×0.3 mm, capacitance of 10 nF and self-inductance of 80 pH.

Then the electric element incorporating wiring board shown in FIG. 5 was made by changing the number of terminal electrodes of the capacitor, number of capacitors incorporated in the dielectric substrate, distance between most proximate via hole conductors and the directions of currents flowing through opposing via hole conductors as shown in Table 4.

APPE resin in the state of varnish and silica powder of indefinite shape were mixed in predetermined proportions. A plurality of insulation sheets each measuring 120 μm in thickness were made by applying doctor blade process to the mixture. Via holes (0.1 mm in diameter) were formed in the insulation sheets by means of carbon dioxide laser. The via holes were filled with a conductive paste including Cu powder to form via hole conductors, thus making insulation sheets 145, 147, 149, 151 that are to form the insulation layers 101, 103, 105, 109 shown in FIG. 5.

Then through hole for the cavity that as slightly larger than the capacitor to be housed therein was formed in the insulation sheet 155 having thickness similar to the insulation sheets 145, 147, 149, 151 by trepanning using carbon dioxide laser. Similarly, via holes (0.1 mm in diameter) were formed by means of carbon dioxide laser. The via holes were filled with a conductive paste including Cu powder thereby to form via hole conductors, thus making the insulation sheet 155 that is to form the insulation layer 107 shown in FIG. 5.

An adhesive was applied to the surface of a transfer sheet made of polyethylene terephthalate (PET) resin, and the surface was entirely covered with a copper foil having thickness of 12 μm and surface roughness of 0.8 μm. With a dry film resist being applied to the surface, the sheet was exposed to light, developed and then dipped in ferric chloride solution to remove unnecessary portions by means of a spray etching apparatus, thereby forming a transfer sheet having a conductive layer made of the copper foil being formed thereon.

After pressing the conductive layer side of the transfer sheet into contact with the surfaces of the insulation sheets 145, 147, 149, 151 having the via hole conductors with a pressure of 20 kg/cm² at a temperature of 130° C., the transfer sheet was removed while leaving the conductive layer on the insulation sheets 145, 147, 149, 151.

Then the laminated ceramic capacitor was temporarily placed in the cavity of the insulation sheet 155 having the through hole for cavity and the via hole conductors formed therein.

The capacitor was coated on both sides thereof with an epoxy resin adhesive 124 including spherical silica. The insulation sheets 145, 147, 149, 151 having the conductive layer and the via hole conductors made in the process described above were temporarily laminated on the front surface and the back surface of the insulation sheet 155.

The laminate was placed in a vacuum hot press chamber and heated at a rate of 7° C./min. under a pressure of 10 kg/cm². When the temperature reached 100° C., the temperature was maintained for 30 minutes, thereby to fasten the capacitor onto the insulation layer. Then the laminate was heated again at the same rate to 220° C. under a pressure of 40 kg/cm², with the maximum temperature of 220° C. being maintained for one hour, to harden the laminate completely. Thus the electric element incorporating wiring board shown in FIG. 5 having the insulation sheets 101, 103, 105, 107, 109 having thickness of 0.1 mm and 0.08 mm was made. The electric element incorporating wiring board made as described above was tested as follows.

Frequency characteristic of impedance in a frequency range from 1.0 MHz to 1.8 MHz was measured using an impedance analyzer, and the capacitance of the capacitor at 1 MHz was also measured. Then inductance was calculated (L at room temperature) from the resonant frequency using the equation of $f_0 = 1/(2\pi(L \cdot C)^{1/2})$ where $f_0$ is the resonant frequency (Hz), C is the capacitance (F) and L is the inductance (H). Range of frequencies (Δf) where the impedance was 0.1 Ω or lower was determined from the impedance curve. Results of these measurements are shown in Table 4.

TABLE 4

| Sample No. | No. of terminal electrodes of capacitor | Direction of current | No. of capacitors mounted | Interval between via hole conductors mm | Capacitance nF | Resonant frequency MHz | Δf (<0.1 Ω) MHz | Inductance (Room temperature) pH |
|---|---|---|---|---|---|---|---|---|
| 4-1 | 8 | Opposite | 2 | 0.25 | 20.2 | 131 | 65 | 75 |
| *4-2 | 8 | Same direction | 2 | 0.25 | 20.1 | 112 | 48 | 108 |
| 4-3 | 8 | Opposite | 2 | 0.25 | 15.4 | 134 | 92 | 86 |
| 4-4 | 8 | Opposite | 2 | 0.5 | 20.1 | 129 | 58 | 78 |
| 4-5 | 8 | Opposite | 2 | 1 | 20.2 | 126 | 51 | 101 |
| 4-6 | 8 | Opposite | 2 | 2 | 20.2 | 120 | 50 | 104 |
| 4-7 | 8 | Opposite | 4 | 0.25 | 40.9 | 147 | 62 | 58 |
| 4-8 | 8 | Opposite | 8 | 0.25 | 82 | 154 | 57 | 46 |
| 4-9 | 2 | Opposite | 2 | 0.25 | 21.2 | 51 | 38 | 542 |
| *4-10 | 2 | Same direction | 2 | 0.25 | 21 | 47 | 35 | 582 |
| 4-11 | 4 | Opposite | 2 | 0.25 | 22.3 | 85 | 46 | 178 |
| *4-12 | 4 | Same direction | 2 | 0.25 | 20.8 | 76 | 41 | 223 |
| 4-13 | 8 | Opposite | 2 | 0.25 | 20.1 | 145 | 67 | 62 |

*Comparative Example

As will be apparent from Table 4, inductance of the wiring board was made lower in the samples No. 4-1, 4-9 and 4-11 of the present invention where currents were caused to flow in the opposite directions through the most proximate pair of via hole conductors, compared to the samples No. 4-2, 4-10 and 4-12 where the currents flowed in the same direction. Inductance was decreased further in the sample No.4–13 made by decreasing the thickness of the insulation layer to 0.08 mm per layer, compared to the sample No. 4-1 made with thickness of 0.1 mm.

In the sample No. 4-3 incorporating capacitors having capacitances of 10 nF and 5 nF, range of frequencies where the impedance was 0.1 Ω or lower was 92 MHz, larger than the case of incorporating ceramic capacitors of the same capacitance (sample No. 4-1).

Further, when the distance between the most proximate pair of via hole conductors was decreased from 2 mm to 0.5 mm (sample Nos. 4-4, 4-5, 4-6), the inductance could be decreased by causing the currents to flow in the opposite directions through the via hole conductors.

In the samples Nos. 4-7 and 4-8 where the number of capacitors incorporated therein was increased to 4 and 8, respectively, the inductance was further decreased by the effect of connecting the capacitors in parallel.

EXAMPLE 5

(Corresponding to the Fifth Embodiment)

(1) A prepreg was made from 55% by volume of A-PPE (thermosetting polyphenylene ether) resin (curing temperature 20° C.) and 45% by volume of glass fabric. Via holes 100 μm in diameter were formed in the prepreg by means of carbon dioxide laser, and the via holes were filled with a conductive paste including copper powder having mean particle size of 5 μm with the particles plated with silver on the surface thereof. A cavity measuring 1.65×1.65 mm, slightly larger than the capacitor (1.6×1.6 mm) to be housed therein, was formed similarly in the prepreg by trepanning using carbon dioxide laser.

(2) An adhesive was applied to the surface of a transfer sheet made of polyethylene terephthalate (PET) resin, and the surface was entirely covered with a copper foil having thickness of 12 μm and surface roughness of 0.8 μm. With a photoresist (dry film) being applied to the surface, the sheet was exposed to light, dipped in ferric chloride solution to remove unnecessary portions by etching, thereby forming the wiring circuit layer. A fine circuit pattern was made consisting of lines 20 μm in width and 20 μm apart from each other.

(3) After pressing the conductive layer side of the transfer sheet into contact with the surface of the insulation sheet a made in the step (1) with a pressure of 50 kg/cm$^2$, the transfer sheet was removed while leaving the wiring circuit layer deposited on the insulation sheet a.

(4) A coating layer made of a resin was formed on the surface of the capacitor. The capacitors were dipped in solutions made by diluting various thermoplastic resins shown in Table 5 by a solvent comprising glycol ether to a concentration of 10% by volume. The capacitors lifted from the solution were subjected to heat treatment at 150° C. for 10 minutes to remove the solvent. This was repeated several times as required to adjust the thickness of the coat layer. The resin deposited on the electrodes that connect the capacitor to the via hole conductors was removed by irradiating laser beam from excimer laser.

(5) The electrodes of the capacitor that was covered by the resin were aligned to make contact with the via hole conductors, placed in the cavity and covered by the insulation sheet laminated thereon.

(6) The laminate was heated at 220° C. for one hour to harden completely, thereby making the multi-layer wiring board. Fluidization of the A-PPE and polyester resin by the heating almost eliminated the gap and brought the capacitor chip and the insulation layer into close contact with each other.

The multi-layer wiring board thus obtained was subjected to 100 cycles of thermal shock test from −55 to 125° C. and, after the test, resistance of the connection between the capacitor and the wiring layer of the wiring board was measured. Samples of which resistance experienced changes in the resistance not greater than 10% were regarded as passing the test, with the passing ratio shown in Table 5.

Solder reflow test was conducted on the multi layer wiring board by holding its temperature at 260° C. for 30 minutes followed by measuring the connection resistance. Samples of which resistance experienced changes in the resistance not greater then 10% were regarded as passing the test, with the passing ratio shown in Table 5.

TABLE 5

| Sample No. | Coating layer | | | Thermal cycle test (%) | Solder reflow test (%) |
| --- | --- | --- | --- | --- | --- |
| | Kind of resin | Glass transition point (° C.) | Thickness (mm) | | |
| *5-1 | No coating | — | — | 0/20 | 0/20 |
| *5-2 | Polyester resin | 130 | 0.5 | 17/20 | 10/20 |
| 5-3 | Polyester resin | 95 | 0.5 | 19/20 | 18/20 |
| 5-4 | Polyester resin | 80 | 0.5 | 20/20 | 20/20 |
| 5-5 | Polyester resin | 60 | 0.5 | 20/20 | 20/20 |
| 5-6 | Polyester resin | 60 | 0.3 | 19/20 | 18/20 |
| 5-7 | Polyester resin | 30 | 0.8 | 20/20 | 20/20 |
| 5-8 | Polyamide resin | 100 | 0.5 | 20/20 | 20/20 |
| 5-9 | Polyurethane resin | 25 | 0.5 | 20/20 | 20/20 |
| *5-10 | Epoxy resin | 150 | 0.5 | 18/20 | 15/20 |

*Comparative Example

As shown in Table 5, the samples No. 5-1 where resin layer was not formed did not pass the thermal cycle test and the solder reflow test. In the samples No. 5-2 of which coating layer was formed from the thermoplastic resin having glass transition point higher than 100° C. and in the samples No. 5-10 of which coating layer was formed from epoxy resin (thermosetting resin), 10% or more of them did not pass the thermal cycle test and the solder reflow test.

Observation of the portions around the wiring circuit layer and the via hole conductors being formed in cross section of the capacitor incorporating wiring board having the coating layer of the specified thermoplastic resin formed thereon showed that the capacitors and the via hole conductors were satisfactorily connected by melting of the low-melting point metal included in the via hole conductor, and continuity test of the interconnections showed no breakage of the interconnections. The capacitors showed no change in the capacitance. The capacitors showed no change in the capacitance also after the thermal cycle test and the solder reflow test.

The embodiments of the present invention have been described in detail, hereinabove, but the description should be considered as illustrative and not restrictive, the spirit and scope of the present invention being limited only by the appended claims.

The present application is based on Japanese Patent Application No. 11-339880 filed in the Japanese Patent Office on Nov. 30, 1999, Japanese Patent Application No. 2000-54000 and Japanese Patent Application No. 2000-53998 filed on Feb. 29, 2000, Japanese Patent Application No. 2000-158824 filed on May 29, 2000 and Japanese Patent Application No. 2000-160749 filed on May 30, 2000, the entire disclosures of these applications being incorporated herein by reference.

What is claimed is:

1. An electric element incorporating wiring board comprising:
   a dielectric substrate having an electronic component mounting surface on a surface thereof;
   an electric element that has a first terminal electrode and a second terminal electrode and is incorporated in the dielectric substrate;
   a first conductive layer and a second conductive layer formed while being insulated from each other between the surface of the dielectric substrate and the electric element in the dielectric substrate; and
   via hole conductors that connect the first terminal electrode and the second terminal electrode to the first conductive layer and the second conductive layer, respectively, and extend the surface of the dielectric substrate from the first and second conductive layers.

2. An electric element incorporating wiring board according to claim 1, wherein the electric element is a capacitor.

3. An electric element incorporating wiring board according to claim 2, wherein the capacitor is a laminated ceramic capacitor.

4. An electric element incorporating wiring board according to claim 1, wherein the electric element has a plurality of first terminal electrodes and second terminal electrodes, while all of the first terminal electrodes are connected to the first conductive layer through the via hole conductors and all of the second terminal electrodes are connected to the second conductive layer through the via hole conductors.

5. An electric element incorporating wiring board according to claim 1, wherein thickness of an insulation layer disposed between the electric element and the surface of the dielectric substrate is 0.3 mm or less.

6. An electric element incorporating wiring board according to claim 1, wherein the dielectric substrate contains at least an organic resin.

7. An electric element incorporating wiring board according to claim 1, wherein the dielectric substrate has a laminated structure including a first insulation layer made up of a mixture of a thermosetting resin and an inorganic filler and a second insulation layer made by impregnating a fabric with a thermosetting resin.

8. An electric element incorporating wiring board according to claim 7, wherein the electric element is embedded in the first insulation layer and the difference in the thermal expansion coefficient between the electric element and the first insulation layer is $7 \times 10^{-6}$/° C. or less.

9. An electric element incorporating wiring board according to claim 7, wherein the electric element is embedded in the first insulation layer and the second insulation layer is disposed on an outermost layer of the dielectric substrate.

10. An electric element incorporating wiring board according to claim 7, wherein the first insulation layer includes 30 to 65% by volume of thermosetting resin and 35 to 70% by volume of inorganic filler.

11. An electric element incorporating wiring board according to claim 7, wherein the inorganic filler includes at least one kind of material selected from $SiO_2Al_2O_3$, AlN and $Si_3N_4$.

12. An electric element incorporating wiring board according to claim 7, wherein the thermosetting resin included in the first insulation layer and second insulation layer includes at least one kind of material selected from polyphenylene ether resin, epoxy resin and cyanate resin.

13. An electric element incorporating wiring board according to claim 1, wherein the via hole conductors are formed by filling via holes made in the dielectric substrate with a metal component.

14. An electric element incorporating wiring board according to claim 1, wherein the first and the second terminal electrodes of the electric element and the via hole conductors are directly connected to each other, while intermetallic compound of Cu and Sn exists in junctions between the first and second terminal electrodes and the respective via hole conductors.

15. An electric element incorporating wiring board according to claim 14, wherein the via hole conductors include Cu and Sn as metal components.

16. An electric element incorporating wiring board according to claim 15, wherein weight ratio Sn/(Cu+Sn) in the metal component is in a range from 0.5 to 0.95.

17. An electric element incorporating wiring board according to claim 14, wherein a conductive layer that includes at least Sn is formed on an outermost surface of the first and the second terminal electrodes of the electric element.

18. An electric element incorporating wiring board according to claim 1, wherein one of adjacent pair of via hole conductors is connected to the first conductive layer and another is connected to the second conductive layer.

19. An electric element incorporating wiring board according to claim 1, wherein a plurality of electric elements each having a first terminal electrode and a second terminal electrode are embedded in the dielectric substrate.

20. An electric element incorporating wiring board according to claim 19, wherein a pair of via hole conductors that are most proximate to each other between adjacent electric elements are connected to different ones of the first and second conductive layers, current flowing through the pair of via hole conductors in directions opposite to each other.

21. An electric element incorporating wiring board according to claim 20, wherein distance between a pair of via hole conductors that are most proximate to each other between the adjacent electric elements is 0.5 mm or less.

22. An electric element incorporating wiring board according to claim 19, wherein the plurality of electric elements include capacitors having different values of capacitance.

23. An electric element incorporating wiring board according to claim 1, wherein the first and second terminal electrodes are made by forming a conductive material on a principal surface of a body of the electric element.

24. An electric element incorporating wiring board according to claim 1, wherein surfaces of the electric element other than the first and second terminal electrodes are covered by a thermoplastic resin having a glass transition point not higher than 100° C.

25. An electric element incorporating wiring board according to claim 24, wherein thickness of the coating layer of the thermoplastic resin is in a range from 5 to 150 μm.

26. An electric element incorporating wiring board according to claim 24, wherein the dielectric substrate includes an insulation layer that contains a PPE (polyphenylene ether) resin.

27. An electric element incorporating wiring board according to claim 24, wherein the thermoplastic resin consists of at least one selected from the groups of polyester resin, polyamide resin and polyurethane resin.

* * * * *